(12) United States Patent
Lu et al.

(10) Patent No.: US 9,646,957 B2
(45) Date of Patent: May 9, 2017

(54) LED PACKAGING STRUCTURE HAVING STACKED ARRANGEMENT OF PROTECTION ELEMENT AND LED CHIP

(71) Applicant: Everlight Electronics Co., Ltd., New Taipei (TW)

(72) Inventors: Tsung-Lin Lu, New Taipei (TW); Jen-Hsiung Lai, New Taipei (TW); Yu-Ching Fang, New Taipei (TW); Chih-Min Lin, New Taipei (TW); I-Chun Hung, New Taipei (TW)

(73) Assignee: Everlight Electronics Co., Ltd., Taiwan (TW)

( * ) Notice: Subject to any disclaimer, the term of this patent is extended or adjusted under 35 U.S.C. 154(b) by 0 days.

(21) Appl. No.: 14/995,167

(22) Filed: Jan. 13, 2016

(65) Prior Publication Data

US 2016/0204090 A1    Jul. 14, 2016

(51) Int. Cl.
*H01L 23/60*     (2006.01)
*H01L 33/52*     (2010.01)
(Continued)

(52) U.S. Cl.
CPC ............ *H01L 25/167* (2013.01); *H01L 23/60* (2013.01); *H01L 33/38* (2013.01); *H01L 33/502* (2013.01);
(Continued)

(58) Field of Classification Search
CPC ....... H01L 23/60; H01L 25/167; H01L 33/38; H01L 33/502; H01L 33/52; H01L 33/56; H01L 33/62; H01L 2224/16245
See application file for complete search history.

(56) References Cited

U.S. PATENT DOCUMENTS

| | | | |
|---|---|---|---|
| 6,054,716 A * | 4/2000 | Sonobe | H01L 25/167 250/552 |
| 2007/0200131 A1* | 8/2007 | Kim | H01L 33/486 257/99 |

(Continued)

FOREIGN PATENT DOCUMENTS

| | | |
|---|---|---|
| TW | 201332138 A1 | 8/2013 |
| TW | 201427093 | 7/2014 |

(Continued)

*Primary Examiner* — Stephen W Smoot
(74) *Attorney, Agent, or Firm* — Han IP Corporation; Andy M. Han

(57) ABSTRACT

A light emitting diode (LED) packaging structure including a metal pad, an electric static discharge (ESD) protection element and an LED chip is provided. The metal pad has a first pad portion having a first top surface with a first concave configured thereon and a second pad portion having a second top surface with a second concave configured thereon. The ESD protection element has two first electrode portions respectively configured in the first concave and the second concave. The LED chip is located above the ESD protection element and has two second electrode portions respectively configured on the first top surface and the second top surface. A frame and a light emitting device having the frame that both include the above LED packaging structure are described herein. A light emitting device having an omni-directional light emitting effect is also described and includes the above LED packaging structure.

20 Claims, 22 Drawing Sheets

(51) Int. Cl.
   *H01L 25/16*   (2006.01)
   *H01L 33/38*   (2010.01)
   *H01L 33/50*   (2010.01)
   *H01L 33/56*   (2010.01)
   *H01L 33/62*   (2010.01)

(52) U.S. Cl.
   CPC .............. *H01L 33/56* (2013.01); *H01L 33/62* (2013.01); *H01L 2224/16245* (2013.01); *H01L 2924/0002* (2013.01); *H01L 2924/15151* (2013.01); *H01L 2924/181* (2013.01); *H01L 2933/005* (2013.01)

(56) References Cited

U.S. PATENT DOCUMENTS

| | | | | |
|---|---|---|---|---|
| 2010/0084683 | A1* | 4/2010 | Lai | H01L 25/167 257/99 |
| 2011/0012151 | A1* | 1/2011 | Ono | H01L 25/167 257/98 |
| 2011/0284882 | A1* | 11/2011 | An | H01L 33/486 257/88 |
| 2013/0001599 | A1* | 1/2013 | Lee | H01L 25/167 257/88 |
| 2013/0200403 | A1* | 8/2013 | Chen | H01L 33/62 257/88 |

FOREIGN PATENT DOCUMENTS

| | | |
|---|---|---|
| TW | 201431042 | 8/2014 |
| TW | M485346 | 9/2014 |

\* cited by examiner

LED PACKAGING STRUCTURE HAVING STACKED ARRANGEMENT OF PROTECTION ELEMENT AND LED CHIP

CROSS-REFERENCES TO RELATED APPLICATIONS

The present disclosure claims the priority benefit of Taiwan Patent Application No. 104101137, filed on Jan. 14, 2015, and Taiwan Patent Application No. 104104319, filed on Feb. 10, 2015, which are incorporated by reference in their entirety.

TECHNICAL FIELD

The present disclosure relates to a light emitting diode (LED) packaging structure, and a frame for the LED packaging structure and a light emitting device using the LED packaging structure.

BACKGROUND

In the application field of the current LEDs, most of the LED chips are now developing towards the form of flip chips in response to the trend of products. Also in response to the trend of miniaturization, packaging structures of chip scale package (CSP) have been developed. That is, the area of the packaging structure should not be exceed the area of the LED chip too much (e.g., being no more than 1.3 times of the area of the LED chip). With this limitation in the area, it is difficult to dispose an electric static discharge (ESD) protection element beside the LED chip in the conventional CSP packaging structures, so the LED chip is likely to be damaged due to electric static discharge.

Additionally, the flip chips may also be bonded with a substrate in various die bonding manners. For example, the electrical connection between the chip and the substrate is achieved through, e.g., direct bonding, eutectic bonding, golden ball bonding, or conductive adhesives bonding.

Different from the traditional packaging technology, the flip chip packaging can not only reduce the size of the packaged chip but also reduce the transmission distance of electronic signals between the chip and the substrate to achieve advantages such as low signal interference and electrical stability. Moreover, to enhance the machinability of the frame and to achieve a good bonding between the frame and pins disposed below the frame, the frame usually adopts the epoxy molding compound (EMC) as a main material thereof.

As shown in a schematic perspective view of a frame 100 according to the prior art in FIG. 1, the frame 100 comprises a housing 120, a lead 130, a gap filler 140 and a light transmitting encapsulant 150. The lead 130 has a first electrode portion 131 and a second electrode portion 132 adjacent to each other, there is a gap 133 between the first electrode portion 131 and the second electrode portion 132, the gap filler 140 is disposed within the gap 133, the LED 110 may be adapted to be fixed and electrically connected with the first electrode portion 131 and the second electrode portion 132, and the light transmitting encapsulant 150 may be adapted to fill the housing 120 and cover the LED chip 110.

However, before the frame 100 is subjected to the high-temperature die bonding stage, as shown in FIG. 2A, the gap filler 140 almost fills the whole gap 133 before the gap filler 140 is under the high temperature. After the frame 100 is subjected to a high-temperature bonding stage such as the direct boding, the golden ball bonding or the eutectic bonding, as shown in FIG. 2B, an expanded volume 142 of the gap filler 140 generated under the high temperature will protrude from the gap 133 due to the insufficient accommodating space within the gap 133. Therefore, a bottom surface 112 of the LED chip 110 will be in contact with the protruding expanded volume 142 of the gap filler 140, which results in the damage of the inner structure of the LED chip 110 or the bonding surface 134 between the bottom surface 112 of the LED chip 110 and the lead 130 due to the stress from the protruding expanded volume.

Additionally, in the conventional light emitting device, the LED chip is arranged on one surface of a substrate and then emits light towards the direction away from the surface. Under this arrangement, almost all the light rays emitted by the LED chip propagate towards the same direction and only few light rays (or no light ray) reach/reaches the other side of the substrate, so the overall light emitting range of the light emitting device is not more than 180°. In other words, the light emitting device cannot provide omni-directional light effect. Therefore, such a light emitting device is limited in application; that is, the light emitting device is unsuitable for use in occasions requiring uniform lighting.

In view of the aforesaid problems, the present disclosure provides a novel LED packaging structure, which can comprise an ESD protection element within the size requirements of chip-level packaging. Additionally, the present disclosure also provides a novel frame, which can overcome the problem resulting from the volume expansion of the gap filler and is adapted to support the LED packaging structure to form a light emitting device. The present disclosure further provides a novel light emitting device, which can accommodate with the aforesaid LED packaging structure and has the omni-directional light emitting effect.

SUMMARY

An objective of the present disclosure is to provide a LED packaging structure, which can at least solve the technical problems of reducing the size of the LED packaging structure and providing the LED packaging structure with relatively good resistance to ESD.

To achieve the aforesaid objective, the LED packaging structure disclosed by the present disclosure comprises a metal pad, an electric static discharge (ESD) protection element and a light emitting diode (LED) chip. The metal pad has a first pad portion, a second pad portion and a gap, the first pad portion has a first top surface with a first concave disposed thereon, and the second pad portion has a second top surface with a second concave disposed thereon. The ESD protection element has two first electrode portions respectively disposed in the first concave and the second concave. The two first electrode portions are electrically connected to the first pad portion and the second pad portion respectively. The LED chip is located above the ESD protection element and has two second electrode portions respectively disposed on the first top surface and the second top surface. The two second electrode portions are electrically connected to the first pad portion and the second pad portion respectively.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
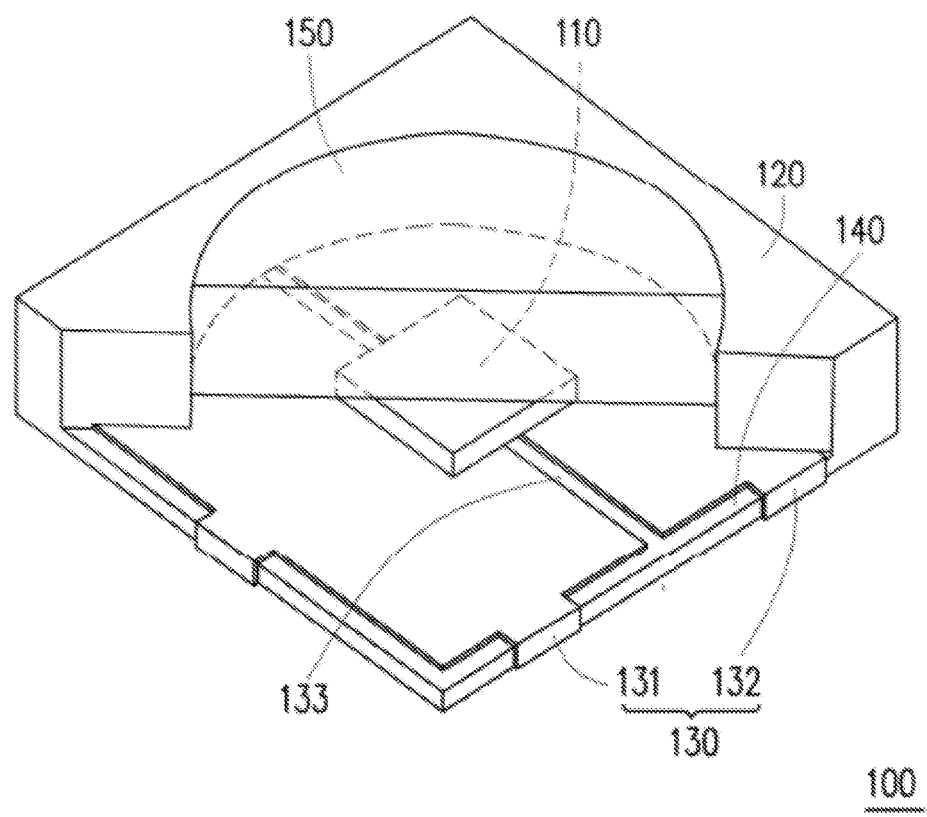
FIG. 1 is a schematic perspective view of a frame according to the prior art.
Figure 2:
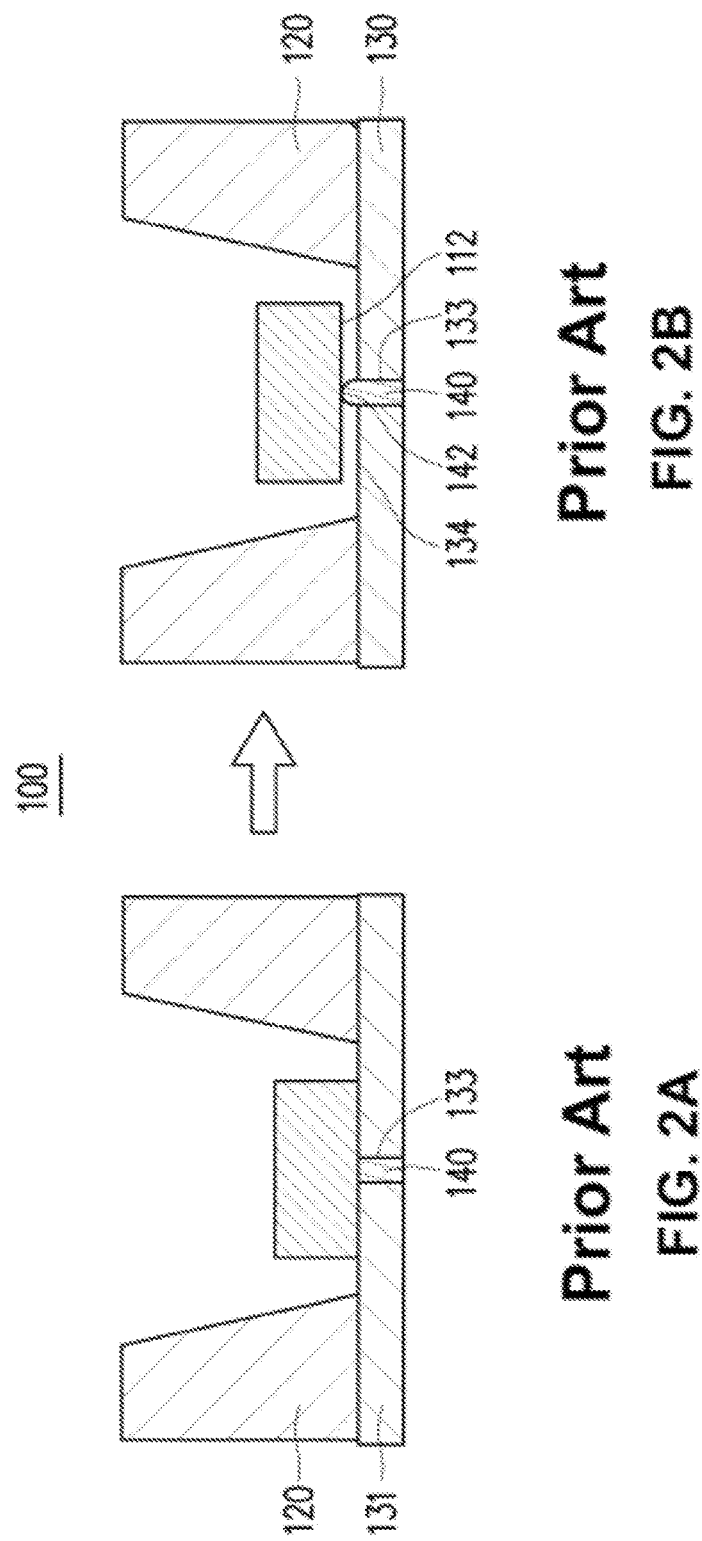
FIG. 2A is a schematic cross-sectional view of the frame according to the prior art before it is subjected to the high-temperature die bonding stage.
FIG. 2B is a schematic cross-sectional view of the frame according to the prior art after it is subjected to the high-temperature die bonding stage.
Figure 3:
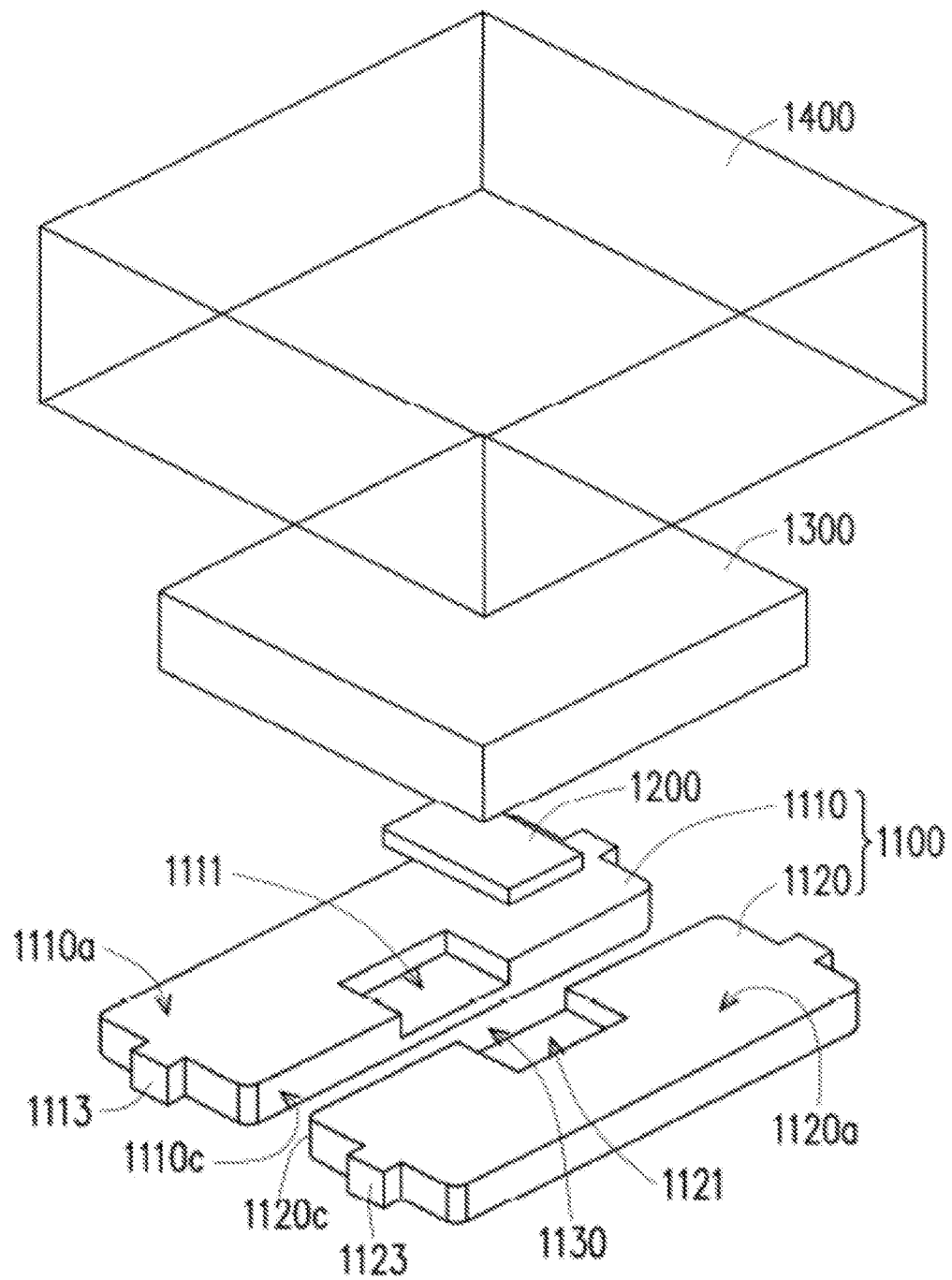
FIG. 3 is a perspective exploded view of a LED packaging structure according to a first embodiment of the present disclosure.
Figure 4:
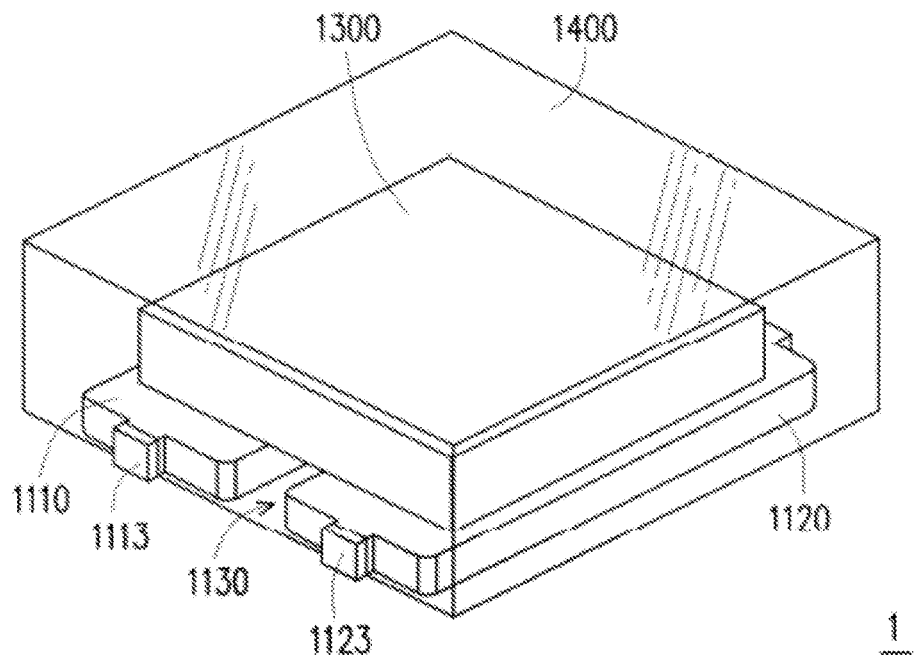
FIG. 4 is a perspective assembled view of the LED packaging structure according to the first embodiment of the present disclosure.
Figure 5:
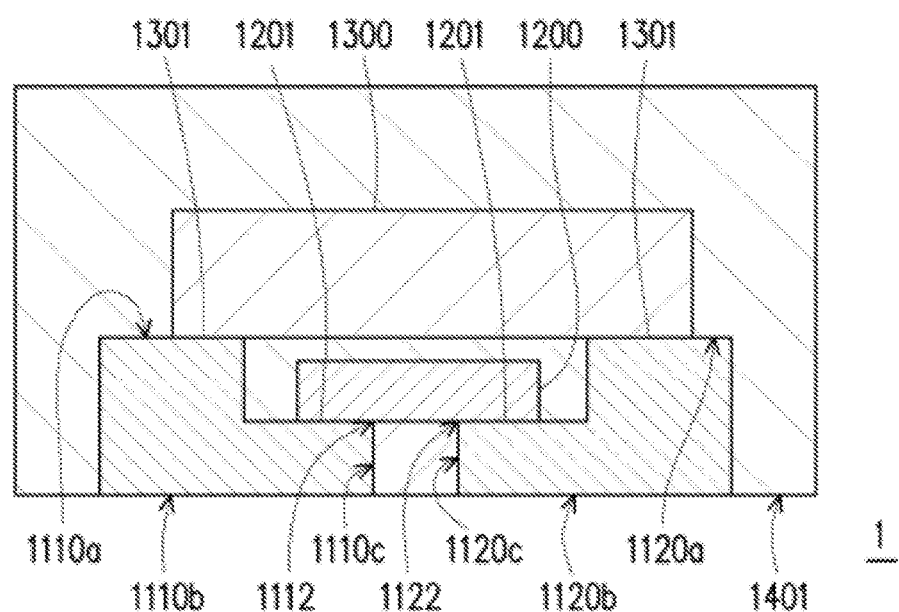
FIG. 5 is a schematic cross-sectional view of the LED packaging structure according to the first embodiment of the present disclosure.

First, please refer to FIG. 3, FIG. 4 and FIG. 5, which are respectively a perspective exploded view, a perspective assembled view and a cross-sectional view of a LED packaging structure according to a first embodiment of the present disclosure. The LED packaging structure 1 according to the first embodiment of the present disclosure comprises a metal pad 1100, an electric static discharge (ESD) protection element 1200 and a light emitting diode (LED) chip 1300, and both the ESD protection element 1200 and the LED chip 1300 are electrically connected to the metal pad 1100. The technical content of the elements will be further described as follows.

The metal pad 1100 has a first pad portion 1110, a second pad portion 1120 and a gap 1130, and the gap 1130 is disposed between the first pad portion 1110 and the second pad portion 1120. The first pad portion 1110 has a first top surface 1110a, a first bottom surface 1110b and a first concave 1111 disposed on the first top surface 1110a, and the second pad portion 1120 has a second top surface 1120a, a second bottom surface 1120b and a second concave 1121 disposed on the second top surface 1120a. The first top surface 1110a is opposite to the first bottom surface 1110b, and the second top surface 1120a is also opposite to the second bottom surface 1120b. Each of the first concave 1111 and the second concave 1121 has a depth, and preferably, the depths of the first concave 1111 and the second concave 1121 may be greater than a thickness of the ESD protection element 1200.

The first pad portion 1110 further has a first side surface 1110c, and the second pad portion 1120 further has a second side surface 1120c. Two side edges of the first side surface 1110c are respectively connected to the first top surface 1110a and the first bottom surface 1110b, and two side edges of the second side surface 1120c are respectively connected to the second top surface 1120a and the second bottom surface 1120b.

The first side surface 1110c and the second side surface 1120c face each other and are spaced apart from each other, so the gap 1130 is located between the first side surface 1110c and the second side surface 1120c. Preferably, the first side surface 1110c has a first notch 1112, the second side surface 1120c has a second notch 1122 opposite to the first notch 1112, the first notch 1112 is in communication with the first concave 1111, and the second notch 1122 is in communication with the second concave 1121. The first notch 1112 and the second notch 1122 may be adapted for the arrangement of the ESD protection element 1200 described later.

The first bottom surface 1110b of the first pad portion 1110 and the second bottom surface 1120b of the second pad portion 1120 may be configured to be electrically connected to a circuit device (not shown) such as a substrate, a circuit board or a conductive wire so that the electrical energy can be supplied to the LED packaging structure 1. Moreover, the first pad portion 1110 and the second pad portion 1120 may further respectively have at least one first flange 1113 and at least one second flange 1123, and may be electrically connected with the circuit device via the first flange 1113 and the second flange 1123 so that the electrical energy is supplied to the LED packaging structure 1 to form a side-emitting configuration. Alternatively, the flanges may be used to increase the solder bonding area so as to increase the bonding strength when the first pad portion 1110 and the second pad portion 1120 are electrically connected to the substrate or the like via solder bonding. However, it is not limited that the first/second pad portions must have the first flange 1113/the second flange 1123 in the present disclosure, i.e., the first pad portion 1110 and the second pad portion 1120 may also not have a flange.

The metal pad 1100 (the first pad portion 1110/the second pad portion 1120) is a part of a pad assembly 10 described later after the pad assembly 10 is separated, and in accordance with the structure and the separating procedure of the pad assembly 10, the base material of the metal pad 1100 may for example be copper, iron, aluminum, or an alloy thereof. The first top surface 1110a/the second top surface 1120a and the first bottom surface 1110b/the second bottom surface 1120b may be covered with a protective metal layer. The first concave 1111 and the second concave 1121 may also be or may not be covered with a protective metal layer, and are preferably covered with the protective metal layer to protect the concave portions from being oxidized and thereby reduce the conductivity. Additionally, the side surfaces of the first flange 1113/the second flange 1123 may also be or may not be covered with a protective metal layer, and are preferably covered with the protective metal layer. The protective metal layer is used to protect the pad portion from being oxidized and thereby reduce the conductivity. The material of the protective metal layer may for example be gold, silver, nickel, platinum, tin, or an alloy of the aforesaid metal. The protective metal layer may also be a multilayered structure; that is, the protective metal layer is for example a laminated structure of the aforesaid metal/alloy. It shall be noted that, the side surfaces of the first flange 1113/the second flange 1123 are generated after the metal pad 1100 is separated from a connector described later, so the protective metal layer on the side surfaces may be generated by subsequent processing, and the material of the protective metal layer on the side surfaces may be different from that of the protective metal layer which may be applied to the first top surface 1110a/the second top surface 1120a and the first bottom surface 1110b/the second bottom surface 1120b. The protective metal layer on the side surface may also be formed through extension of the protective metal layer on the top surface or the bottom surface to cover the side surface of the flange during the separating procedure, and in this case, the material of the protective metal layer on the top surface/bottom surface is the same as that of the metal protective layer on the side surface of the flange.

The ESD protection element 1200 may be an electronic element having the ESD protection function, such as a Zener diode or a varistor or the like. Structurally, the ESD protection element 1200 has two first electrode portions 1201 (i.e., an anode portion and a cathode portion), the two first electrode portions 1201 are respectively disposed in the first concave 1111 and the second concave 1121, and the two first electrode portions 1201 are electrically connected to the first pad portion 1110 and the second pad portion 1120 respectively.

Preferably, when the two first electrode portions 1201 are disposed in the first concave 1111 and the second concave 1121, the ESD protection element 1200 will not protrude above the first top surface 1110a and the second top surface 1120a (if the thickness of the ESD protection element 1200 is smaller than the depth of the first concave 1111 and the second concave 1121). Furthermore, the ESD protection element 1200 may pass through the first notch 1112 and the second notch 1122 of the metal pad 1100 so that the two first electrode portions 1201 are easily disposed in the first concave 1111 and the second concave 1121 respectively.

The LED chip 1300 is located above the ESD protection element 1200 as a whole, and the LED chip 1300 may cover the whole ESD protection element 1200 and may also be spaced from the ESD protection element 1200. The LED chip 1300 has two second electrode portions 1301 (i.e., an anode portion and a cathode portion), the two second electrode portions 1301 are respectively disposed on the first top surface 1110a and the second top surface 1120a, and the two second electrode portions 1301 are electrically connected to the first pad portion 1110 and the second pad portion 1120 respectively.

Via the first pad portion 1110 and the second pad portion 1120, the two second electrode portions 1301 of the LED chip 1300 may be electrically connected to the two first electrode portions 1201 of the ESD protection element 1200 respectively (in other words, the ESD protection element 1200 and the LED chip 1300 may form a parallel circuit) so that the ESD protection element 1200 can protect the LED chip 1300 from being affected by the electric static discharge.

Preferably, electrically connecting the metal pad 1100 and the LED chip 1300 to the first pad portion 1110 and the second pad portion 1120 is not done through wire bonding in order to avoid increasing the area of the metal pad 1100 due to the wire bonding. Thus, the ESD protection element 1200 and the LED chip 1300 will each be a flip chip, and the ESD protection element 1200 and the LED chip 1300 are electrically connected to the metal pad 1100 through eutectic die bonding, silver adhesive die bonding or the like.

When the ESD protection element 1200 and the LED chip 1300 are flip chips, the two second electrode portions 1301 of the LED chip 1300 will be oriented towards the first top surface 1110a and the second top surface 1120a, and the two first electrode portions 1201 of the ESD protection element 1200 will be oriented towards the bottom surfaces of the first concave 1111 and the second concave 1121.

Through the aforesaid configuration, only the metal pad 1100 and the LED chip 1300 will be seen and the ESD protection element 1200 will not be seen when the structure is observed from above. In other words, the area of the metal pad 1100 (i.e., the product of the length and the width thereof) may be only slightly greater than the area of the LED chip 1300, and the arrangement of the ESD protection element 1200 will not increase the area of the metal pad 1100.

In this way, the overall area of the LED packaging structure 1 will not be increased due to the arrangement of the ESD protection element 1200, so the LED packaging structure 1 not only can have a relatively small size (e.g., a size that satisfies the CSP specifications) but also can have a relatively good anti-static electricity capability (e.g., at least being capable of bearing a static voltage of ±8 KV).

It shall be additionally appreciated that, the shapes of the first pad portion 1110 and the second pad portion 1120 (and the shapes of the first concave 1111 and the second concave 1121) are generally symmetrical. However, if there are different demands (e.g., for fitting the shape or size of the ESD protection element 1200 or the LED chip 1300), then the first pad portion 1110 and the second pad portion 1120 may also have different shapes, or the first concave 1111 and the second concave 1121 may correspondingly have different shapes, and this is not limited by the disclosure of this embodiment.

Optionally, the LED packaging structure 1 may further comprise a packaging encapsulant 1400, and the packaging encapsulant 1400 covers at least a part of the metal pad 1100, the ESD protection element 1200 and the LED chip 1300. The packaging encapsulant 1400 may be a transparent encapsulant or a fluorescent encapsulant (i.e., a kind of packaging encapsulant 1400 containing a fluorophore), so the light emitted from the LED chip 1300 will not be blocked by the packaging encapsulant 1400 and the wavelength of the light can further be changed by the packaging encapsulant 1400. The LED packaging structure 1 having the fluorescent encapsulant may emit light of the white light spectrum, i.e., is known as a white chip in the art. Additionally, there is no particular limitation in the top-view area of the packaging encapsulant 1400 (i.e., the area of the surface facing away from the second electrode portion 1301) relative to the LED chip 1300 when observed form above. However, the area is preferably smaller than 1.3 times of the top-view area of the LED chip 1300 and more preferably smaller than 1.2 times of the top-view area of the LED chip 1300 because this can provide a relatively small packaging volume to provide a relatively high product adaptability.

In the present disclosure, the packaging encapsulant 1400 may comprise a fluorophore, a diffusant, an anti-settling agent or any combination thereof. In particular, the fluorophore may be one or more selected from a group consisting of: $Sr_5(PO_4)_3Cl:Eu^{2+}$, $(Sr,Ba)MgAl_{10}O_{17}:Eu^{2+}$, $(Sr,Ba)_3MgSi_2O_8:Eu^{2+}$, $SrAl_2O_4:Eu^{2+}$, $SrBaSiO_4:Eu^{2+}$, CdS:In, $CaS:Ce^{3+}$, $Y_3(Al,Gd)_5O_{12}:Ce^{3+}$, $Ca_3Sc_2Si_3O_{12}:Ce^{3+}$, $SrSiON:Eu^{2+}$, $ZnS:Al^{3+},Cu^+$, $CaS:Sn^{2+}$, $CaS:Sn^{2+}$, F, $CaSO_4:Ce^{3+}$, $Mn^{2+}$, $LiAlO_2:Mn^{2+}$, $BaMgAl_{10}O_{17}:Eu^{2+}$, $Mn^{2+}$, $ZnS:Cu^+$, $Cl^-$, $Ca_3WO_6:U$, $Ca_3SiO_4Cl_2:Eu^{2+}$, $Sr_xBa_yCl_zAl_2O_{4-z/2}:Ce^{3+}$, $Mn^{2+}$ (X:0.2, Y:0.7, Z:1.1), $Ba_2MgSi_2O_7:Eu^{2+}$, $Ba_2SiO_4:Eu^{2+}$, $Ba_2Li_2Si_2O_7:Eu^{2+}$, ZnO: S, ZnO:Zn, $Ca_2Ba_3(PO_4)_3Cl:Eu^{2+}$, $BaAl_2O_4:Eu^{2+}$, $SrGa_2S_4$: $Eu^{2+}$, $ZnS:Eu^{2+}$, $Ba_5(PO_4)_3Cl:U$, $Sr_3WO_6:U$, $CaGa_2S_4$: $Eu^{2+}$, $SrSO_4:Eu^{2+}$, $Mn^{2+}$, ZnS:P, $ZnS:P^{3-},Cl^-$, $ZnS:Mn^{2+}$, $CaS:Yb^{2+}$, Cl, $Gd_3Ga_4O_{12}:Cr^{3+}$, $CaGa_2S_4:Mn^{2+}$, Na(Mg, Mn)$_2$LiSi$_4$O$_{10}$F$_2$:Mn, $ZnS:Sn^{2+}$, $Y_3Al_5O_{12}:Cr^{3+}$, $SrB_8O_{13}$: $Sm^{2+}$, $MgSr_3Si_2O_8:Eu^{2+}$, $Mn^{2+}$, $\alpha$-SrO.3B$_2$O$_3$:Sm$^{2+}$, ZnS—CdS, $ZnSe:Cu^+,Cl$, $ZnGa_2S_4:Mn^{2+}$, $ZnO:Bi^{3+}$, BaS:Au,K, $ZnS:Pb^{2+}$, $ZnS:Sn^{2+}$, $Li^+$, ZnS:Pb,Cu, $CaTiO_3:Pr^{3+}$, $CaTiO_3:Eu^{3+}$, $Y_2O_3:Eu^{3+}$, $(Y,Gd)_2O_3:Eu^{3+}$, $CaS:Pb^{2+}$, $Mn^{2+}$, $YPO_4:Eu^{3+}$, $Ca_2MgSi_2O_7:Eu^{2+}$, $Mn^{2+}$, $Y(P,V)O_4$: $Eu^{3+}$, $Y_2O_2S:Eu^{3+}$, $SrAl_4O_7:Eu^{3+}$, $CaYAlO_4:Eu^{3+}$, $LaO_2S$: $Eu^{3+}$, $LiW_2O_8:Eu^{3+}$, $Sm^{3+}$, $(Sr,Ca,Ba,Mg)_{10}(PO_4)_6C_{12}$: $Eu^{2+}$, $Mn^{2+}$, $Ba_3MgSi_2O_8$: $Eu^{2+}$, $Mn^{2+}$, $ZnS:Mn^{2+}$, $Te^{2+}$, $Mg_2TiO_4:Mn^{4+}$, $K_2SiF_6:Mn^{4+}$, $SrS:Eu^{2+}$, $Na_{1.23}K_{0.42}Eu_{0.12}TiSi_4O_{11}$, $Na_{1.23}K_{0.42}Eu_{0.12}TiSi_5O_{13}$: $Eu^{3+}$, CdS:In,Te, $CaAlSiN_3:Eu^{2+}$, $CaSiN_3:Eu^{2+}$, $(Ca,Sr)_2Si_5N_8:Eu^{2+}$, $Eu_2W_2O_7$.

Figure 6:
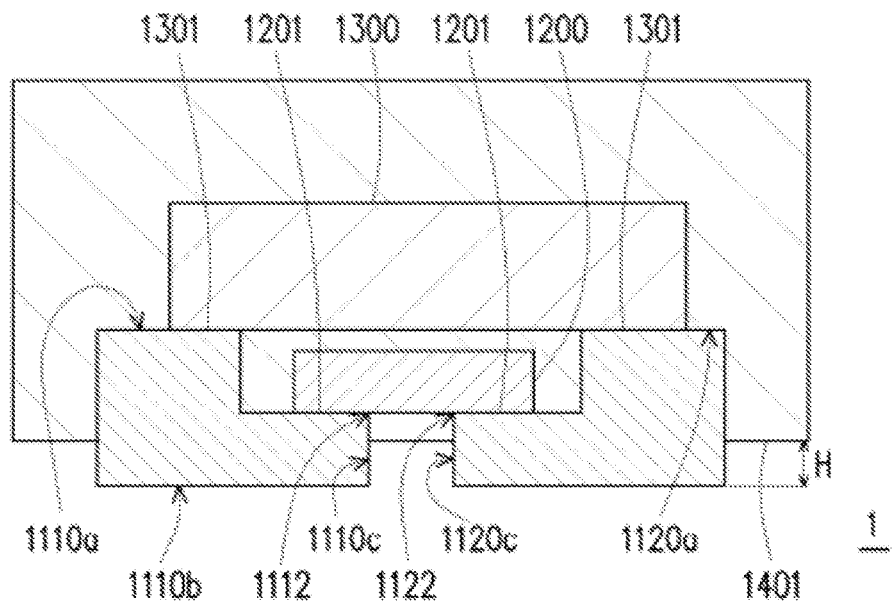
FIG. 6 is a schematic cross-sectional view of a LED packaging structure according to another aspect of the first embodiment of the present disclosure.

Moreover, for electrical connection with other electronic elements or circuit devices, the packaging encapsulant 1400 exposes the first bottom surface 1110b, the second bottom surface 1120b, the first flange 1113 and/or the second flange 1123. Furthermore, the packaging encapsulant 1400 may also fill and cover the gap 1130. Moreover, the packaging encapsulant 1400 may optionally fill into the space between LED chip 1300 and ESD protection element 1200 so as to enhance the Heat dissipation of the LED packaging structure and also avoid the reduction of the reliability due to the air remained in the packaging structure As shown in FIG. 5, in the present disclosure, the packaging encapsulant 1400 has an encapsulant bottom surface 1401. The encapsulant bottom surface 1401 may be substantially coplanar with the first bottom surface 1110b and/or the second bottom surface 1120b, and thus the appearance flatness of the packaging structure may be improved. Alternatively, as shown in FIG. 6 (which is a cross-sectional view of a LED packaging structure according to another aspect of the first embodiment of the present disclosure), the encapsulant bottom surface 1401 may be away from the first bottom surface 1110b and/or the second bottom surface 1120b at a certain height H to provide a depth for the solder to be filled therein. In a preferred implementation of the present disclosure, the height H may be 0.1 to 0.5 times of the thickness of the first pad portion 1110 or the thickness of the second pad portion 1120.

Figure 7:
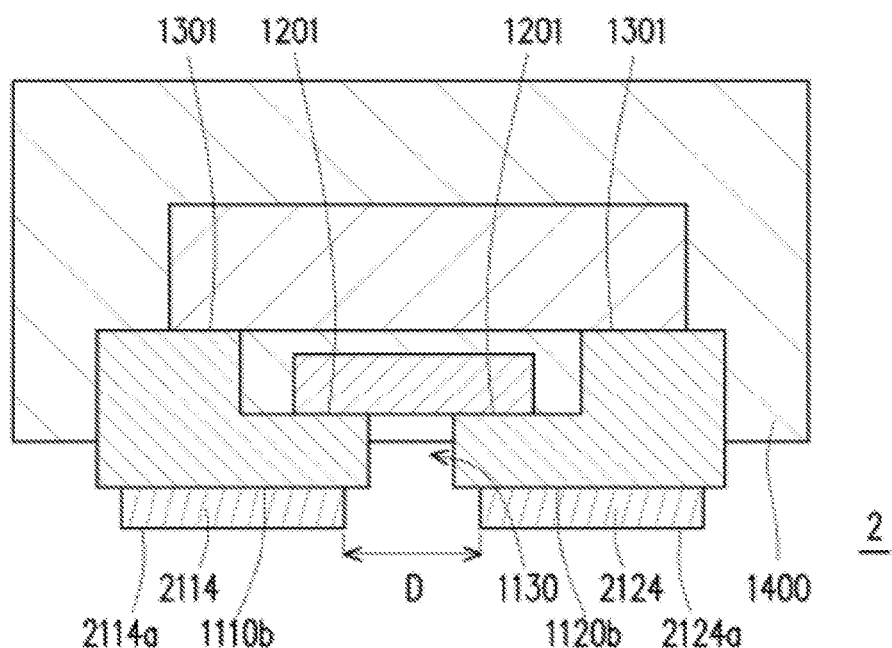
FIG. 7 is a schematic cross-sectional view of a LED packaging structure according to a second embodiment of the present disclosure.

Next please refer to FIG. 7, which is a cross-sectional view of a LED packaging structure according to a second embodiment of the present disclosure. A LED packaging structure 2 of the second embodiment is similar to the LED packaging structure 1 of the first embodiment, and the difference therebetween at least lies in that: the LED packaging structure 2 further comprises a first solder pad 2114 and a second solder pad 2124.

Specifically, the first solder pad 2114 is disposed under the first bottom surface 1110b, and the second solder pad 2124 is disposed under the second bottom surface 1120b. The first solder pad 2114 and the second solder pad 2124 may each be a metal sheet or a conductive sheet and are adhered to the first pad portion 1110 and the second pad portion 1120 via soldering or a conductive material.

Thereby, the first bottom surface 1110b of the first pad portion 1110 and the second bottom surface 1120b of the second pad portion 1120 may be electrically connected to the circuit device via the first solder pad 2114 and the second solder pad 2124. The first solder pad 2114 and the second solder pad 2124 respectively have a first solder surface 2114a and a second solder surface 2124a, and each of the first solder surface 2114a and the second solder surface 2124a may be coated with a solder (or a conductive material, not shown) to be electrically connected with the circuit device.

There is an interval D between the first solder pad 2114 and the second solder pad 2124, and the interval D is wider than the gap 1130. This wider interval D may allow the "two solders respectively applied to the first solder surface 2114a and the second solder surface 2124a" to be spaced apart at a relatively large distance so as to avoid the short circuit resulting from the contact of the two solders due to the flow of the two solders before they are cured. Moreover, the wider interval D is more beneficial for solder-coating tools or machines with a relatively insufficient processing accuracy, because it is difficult for the tools or machines with the relatively insufficient processing accuracy to accurately control the distance between the two solders or the coating amount of the solders (i.e., it is difficult to make the distance between the two solders smaller than the interval D).

As shown in FIG. 7, the packaging encapsulant 1400 does not cover the first solder pad 2114 and the second solder pad 2124, i.e., completely exposes the first solder pad 2114 and the second solder pad 2124. However, in another implementation of the present disclosure, the packaging encapsulant 1400 may further at least cover a part of the first solder pad 2114 and the second solder pad 2124 (not shown), but the packaging encapsulant 1400 exposes the first solder surface 2114a and the second solder surface 2124a so that the first solder surface 2114a and the second solder surface 2124a may still be coated with solders.

Figure 8:
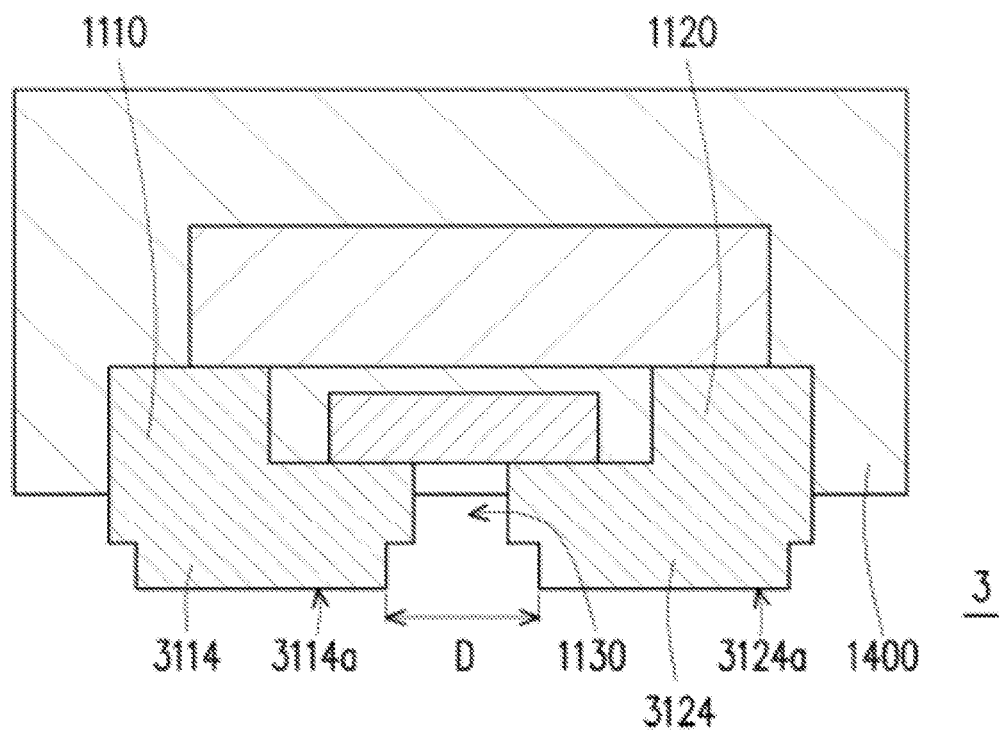
FIG. 8 is a schematic cross-sectional view of a LED packaging structure according to a third embodiment of the present disclosure.

Next please refer to FIG. 8, which is a cross-sectional view of a LED packaging structure according to a third embodiment of the present disclosure. A LED packaging structure 3 of the third embodiment is similar to the LED packaging structure 2 of the second embodiment, and the difference therebetween at least lies in that: the first solder pad 3114 and the second solder pad 3124 are formed through punching, casting, etching or the like during the manufacturing of the first pad portion 1110 and the second pad portion 1120 so that the first pad portion 1110 and the first solder pad 3114 are formed integrally, and the second pad portion 1120 and the second solder pad 3124 are formed integrally.

Similarly, there is an interval D between the first solder pad 3114 and the second solder pad 3124, the interval D is wider than the gap 1130, and the packaging encapsulant 1400 at least covers a part of the first solder pad 3114 and the second solder pad 3124 and exposes the first solder surface 3114a and the second solder surface 3124a, and this will not be further described herein.

Figure 9:
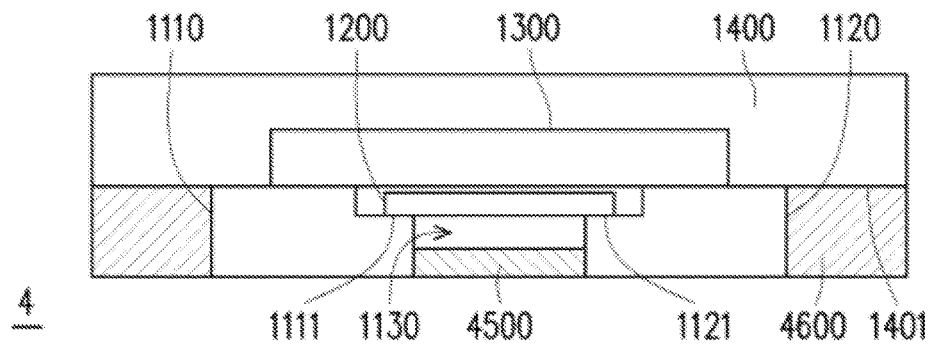
FIG. 9 is a schematic cross-sectional view of a LED packaging structure according to a fourth embodiment of the present disclosure.

Next please refer to FIG. 9, which is a cross-sectional view of a LED packaging structure according to a fourth embodiment of the present disclosure. A LED packaging structure 4 of the fourth embodiment is similar to the LED packaging structure 1 of the first embodiment, and the difference therebetween at least lies in that: the LED packaging structure 4 further comprises a gap filler 4500 and a peripheral filler 4600 made of resin materials. The gap filler 4500 is stuffed between the first pad portion 1110 and the second pad portion 1120, and the peripheral filler 4600 encloses external sides of the first pad portion 1110 and the second pad portion 1120. With the assistance of the gap filler 4500 and the peripheral filler 4600, the mechanical strength of the LED packaging structure may be increased, and the failure of the LED packaging structure in the subsequent bonding operation is avoided, e.g., the poor electrical connection resulting from the warp of the first pad portion/the second pad portion, or the damage of the internal structure of the LED chip 1300. Additionally, in this embodiment, the encapsulant bottom surface 1401 of the packaging encapsulant 1400 is substantially coplanar with the die bonding surface at which the LED chip 1300 is in contact with the first pad portion 1110 and the second pad portion 1120. Additionally, the gap filler 4500 is preferably not higher than the height of the gap 1130 to accommodate the expanded volume of the gap filler 4500 that is generated due to thermal expansion so as to prevent the expanded volume from overly pressing the ESD protection element 1200 and causing the poor electrical connection between the ESD protection element 1200 and the first pad portion 1110/the second pad portion 1120.

Figure 10:
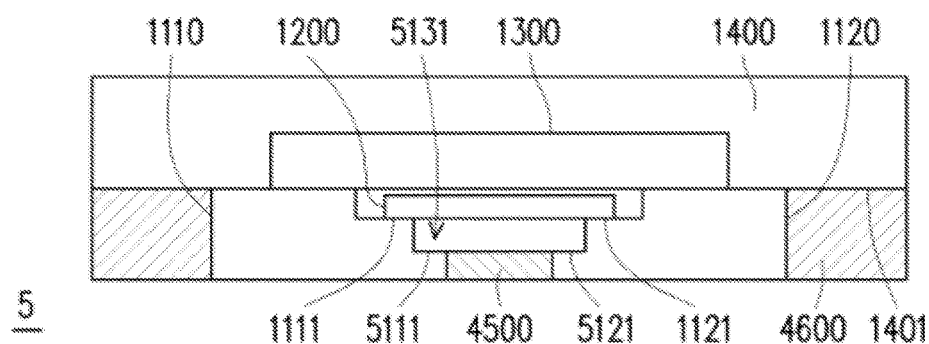
FIG. 10 is a schematic cross-sectional view of a LED packaging structure according to a fifth embodiment of the present disclosure.

To enhance the effect of accommodating the expanded volume of the gap filler 4500, the LED packaging structure of the present disclosure may also comprise a buffering space. Please refer to FIG. 10, which is a cross-sectional view of a LED packaging structure according to a fifth embodiment of the present disclosure. A LED packaging structure 5 of the fifth embodiment is similar to the LED packaging structure 4 of the fourth embodiment, and the difference therebetween at least lies in that: the first pad portion 1110 of the LED packaging structure 5 also has a first lower concave 5111 in addition to the first concave 1111, the second pad portion 1120 also has a second lower concave 5121 in addition to the second concave 1121, and the first lower concave 5111 and the second lower concave 5121 together form a buffering space 5031. The buffering space 5031 is located under the ESD protection element 1200, thereby accommodating the expanded volume of the gap filler 4500 that is generated during the manufacturing/heating process.

The above description describes the LED packaging structures 1 to 5 according to the embodiments of the present disclosure, and as can be known from the above description, the first concave and the second concave are disposed on the first pad portion and the second pad portion of the metal pad in the LED packaging structures 1 to 5 so that the ESD protection element may be disposed within the first concave and the second concave. Thereby, the LED chip can shield the ESD protection element when the LED chip is disposed on the metal pad. Therefore, only the LED chip and the metal pad can be seen when the LED packaging structure is observed from right above so that the overall LED packaging structure may have a relatively small size and still have relatively good resistance to ESD.

Next please refer to FIG. 11A to FIG. 11E, which are schematic views illustrating steps of a method for manufacturing a LED packaging structure according to an embodiment of the present disclosure. In this embodiment, a method for manufacturing a LED packaging structure (which is called a manufacturing method for short hereinafter) is proposed. The manufacturing method can be used to manufacture for example the aforesaid LED packaging structures 1 to 5, so reference may be made to the technical content of the LED packaging structures 1 to 5 for the technical content of the manufacturing method. Moreover, the order in which the following steps are executed may be changed in principle and is not limited by the order in which the steps are described. The manufacturing method may comprise the following steps.

In step S1, a metal pad 1100 is provided. As shown in FIG. 9A, similar to the aforesaid first to fifth embodiments, the metal pad 1100 has a first pad portion 1110 and a second pad portion 1120 spaced apart from each other and a gap 1130, and the gap 1130 is disposed between the first pad portion 1110 and the second pad portion 1120. The first pad portion 1110 has a first top surface 1110a, a first bottom surface 1110b and a first concave 1111 disposed on the first top surface 1110a, and the second pad portion 1120 has a second top surface 1120a, a second bottom surface 1120b and a second concave 1121 disposed on the second top surface 1120a.

Moreover, a first side surface 1110c of the first pad portion 1110 may further have a first notch 1112 in communication with the first concave 1111, and a second side surface 1120c of the second pad portion 1120 may also have a second notch 1122 opposite to the first notch 1112 and in communication with the second concave 1121.

Figure 11A:
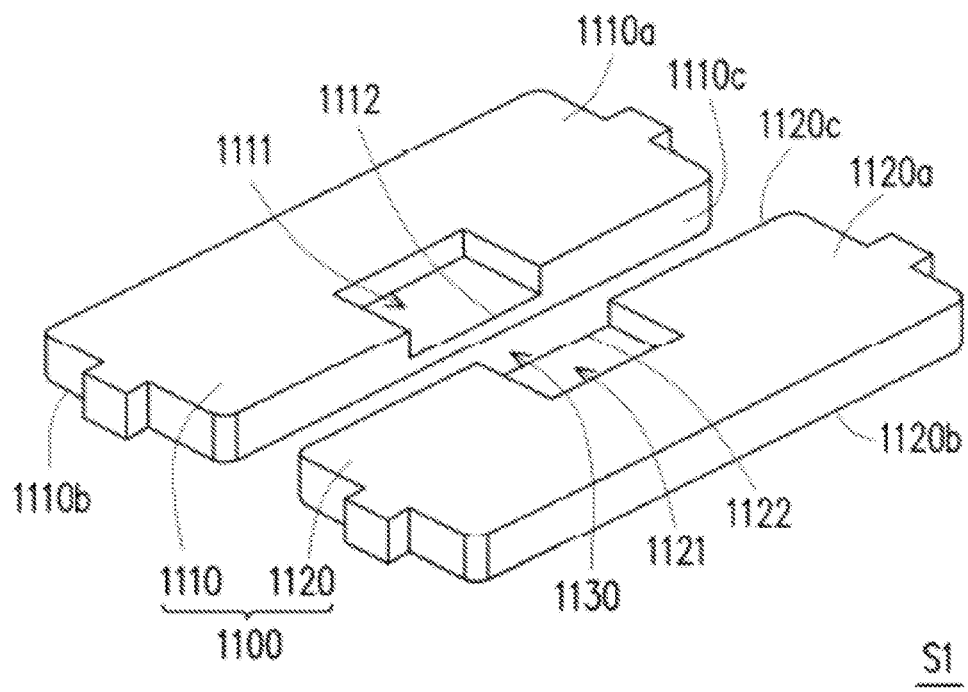
FIG. 11A to FIG. 11E are schematic views illustrating steps of a method for manufacturing a LED packaging structure according to an embodiment of the present disclosure.
Figure 11B:
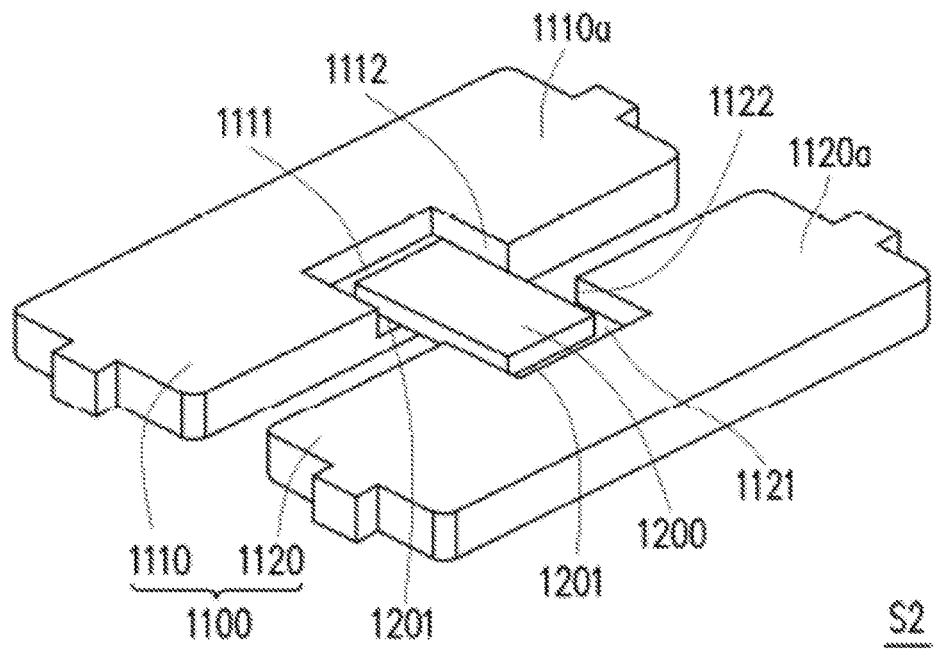

Next, as shown in FIG. 11B, in step S2, an ESD protection element 1200 is disposed in the first concave 1111 and the second concave 1121, and preferably, the ESD protection element 1200 does not protrude from the first top surface 1110a and the second top surface 1120a. The ESD protection element 1200 may be a Zener diode or a varistor. Specifically, the step S2 is to make the two first electrode portions 1201 of the ESD protection element 1200 respectively disposed in the first concave 1111 and the second concave 1121 and electrically connected to the first pad portion 1110 and the second pad portion 1120 respectively.

Preferably, the step S2 is to make the ESD protection element 1200 pass through the first notch 1112 and the second notch 1122 so that the two first electrode portions 1201 are respectively disposed in the first concave 1111 and the second concave 1121.

The first electrode portion 1201 may be electrically connected with the metal pad 1100 in the following way of: disposing the two first electrode portions 1201 of the ESD protection element 1200 in the form of a flip chip into respectively the first concave 1111 and the second concave 1121. In this case, the two first electrode portions 1201 may be electrically connected to the first pad portion 1110 and the second pad portion 1120 respectively through eutectic die bonding, silver adhesive die bonding or the like.

Figure 11C:
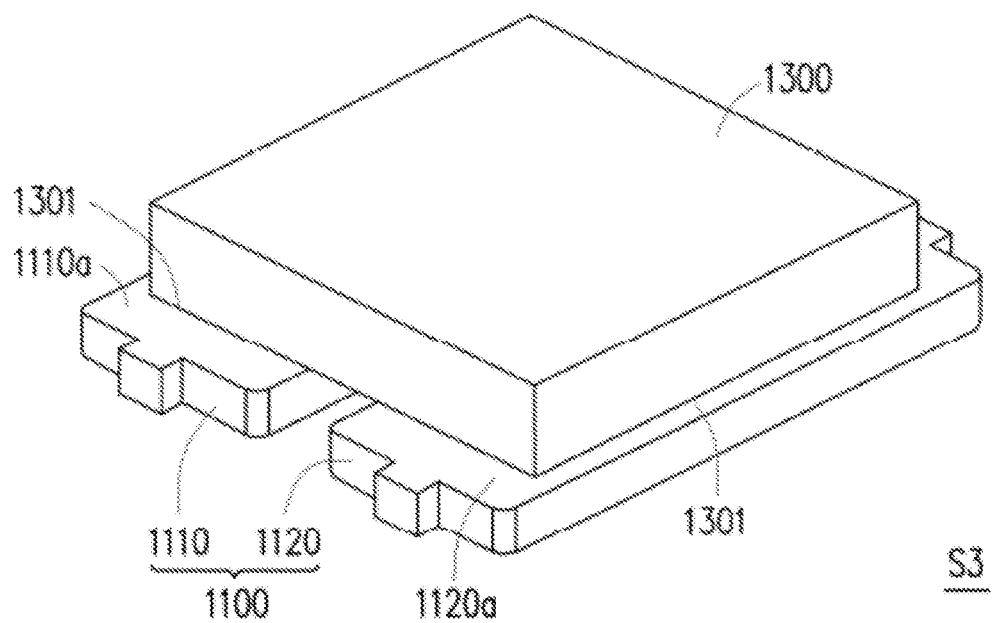

Next, as shown in FIG. 11C, in step S3, an LED chip 1300 is disposed above the ESD protection element 1200 so that the LED chip 1300 covers the ESD protection element 1200, and the LED chip 1300 and the ESD protection element 1200 are electrically connected with the metal pad 1100. Specifically, the step S3 is to dispose the two second electrode portions 1301 of the LED chip 1300 respectively on the first top surface 1110a and the second top surface 1120a so that the two second electrode portions 1301 are electrically connected to the first pad portion 1110 and the second pad portion 1120 respectively.

Preferably, the LED chip 1300 is disposed on the first top surface 1110a and the second top surface 1120a in the form of a flip chip, and in this case, the two second electrode portions 1301 may be electrically connected to the first pad portion 1110 and the second pad portion 1120 respectively through eutectic die bonding, silver adhesive die bonding or the like.

Figure 11D:
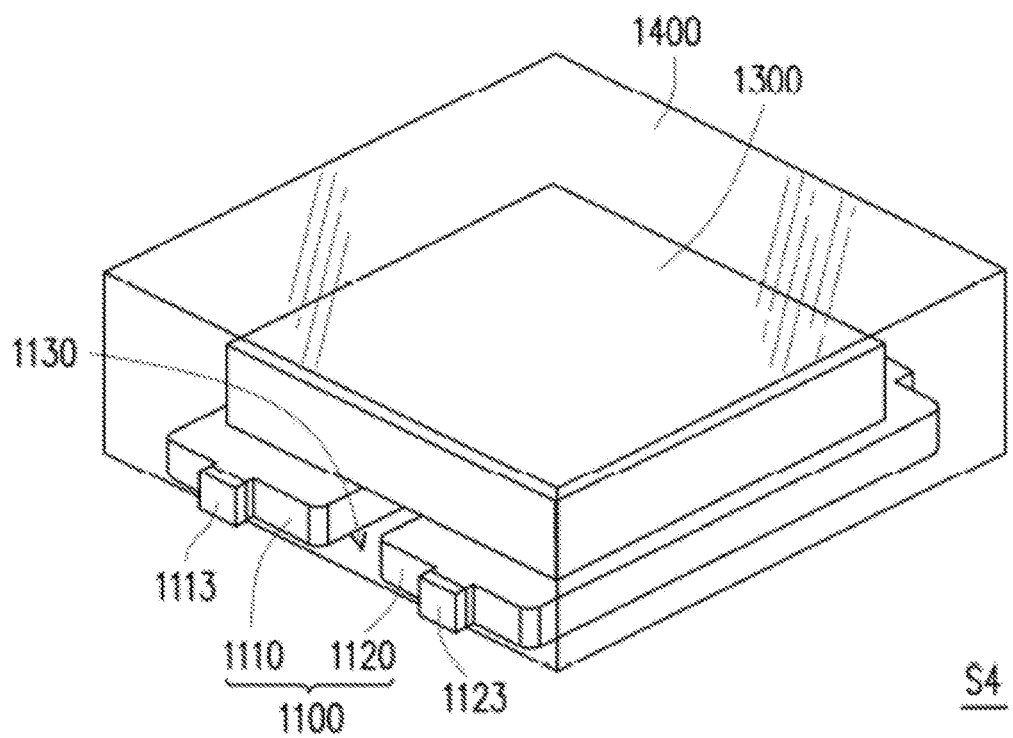

The manufacturing method of a sixth embodiment may further optionally comprise step S4. As shown in FIG. 11D, in the step S4, a packaging encapsulant 1400 is used to cover a part of the metal pad 1100, the ESD protection element 1200 and the LED chip 1300. Moreover, the step S4 may further comprise filling and covering the gap 1130 with the packaging encapsulant 1400 so that the manufactured LED packaging structure has a relatively good structural strength.

Preferably, covering the aforesaid elements by the packaging encapsulant 1400 further comprises exposing the connection surface of the LED packaging structure, that is to be connected with other circuit devices, outside the packaging encapsulant 1400, e.g., exposing the first bottom surface 1110b and the second bottom surface 1120b outside the packaging encapsulant 1400 (not shown), or exposing a first flange 1113 of the first pad portion 1110 and a second flange 1123 of the second pad portion 1120 outside the packaging encapsulant 1400.

Figure 11E:
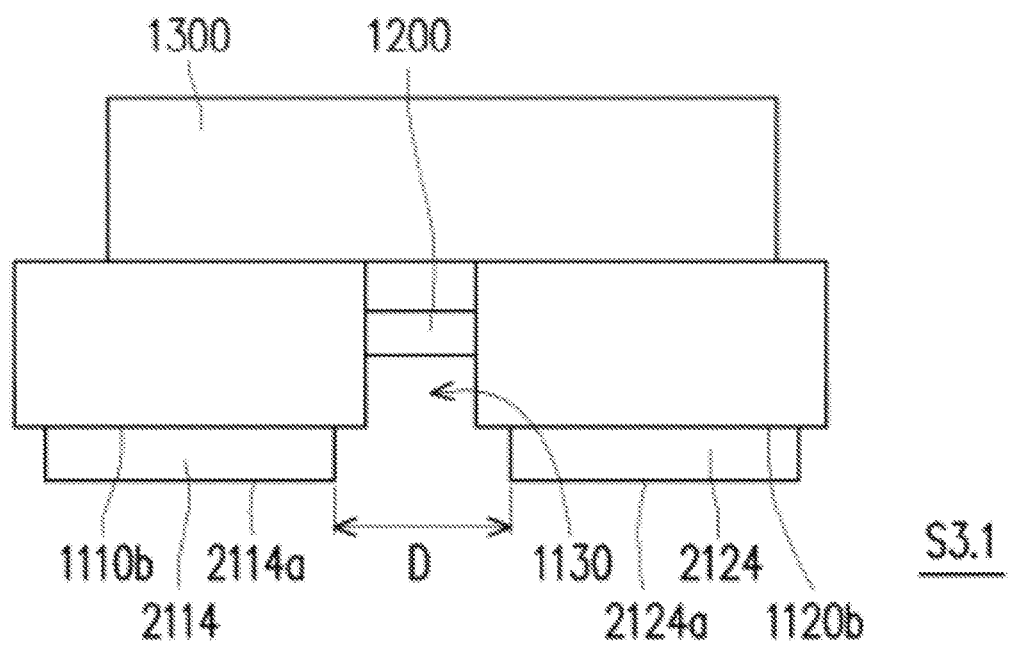

Additionally, in part implementations, step S3.1 may optionally be executed before disposing the packaging encapsulant 1400. As shown in FIG. 11E, in the step S3.1, a first solder pad 2114 and a second solder pad 2124 are respectively disposed under the first bottom surface 1110b and the second bottom surface 1120b, and an interval D between the first solder pad 2114 and the second solder pad 2124 is wider than the gap 130.

However, as shown in FIG. 8, the first solder pad 3114 and the second solder pad 3124 may also first be formed integrally with the first pad portion 1110 and the second pad portion 1120 respectively during the production of the metal pad 1100, instead of being limited to be disposed in the manufacturing method.

In the aspect with the step S3.1, the step S4 may further comprise: at least covering a part of the first solder pad 2114 and the second solder pad 2124 with the packaging encapsulant 1400 (shown in FIG. 11D). Similarly, to allow the first solder pad 2114 and the second solder pad 2124 to be electrically connected with other circuit devices, a first solder surface 2114a of the first solder pad 2114 and a second solder surface 2124a of the second solder pad 2124 are exposed outside the packaging encapsulant 1400.

The above description describes the manufacturing method of the LED packaging structures according to the embodiments of the present disclosure, and as can be known from the aforesaid steps, the ESD protection element may be disposed within the first concave and the second concave of the metal pad and the LED chip covers the ESD protection element in the manufacturing method of the present disclosure. Only the LED chip and the metal pad can be seen when the LED packaging structure manufactured by the manufacturing method of the present disclosure is observed from right above so that the LED packaging structure has a relatively small size and still has relatively good resistance to ESD.

Figure 12:
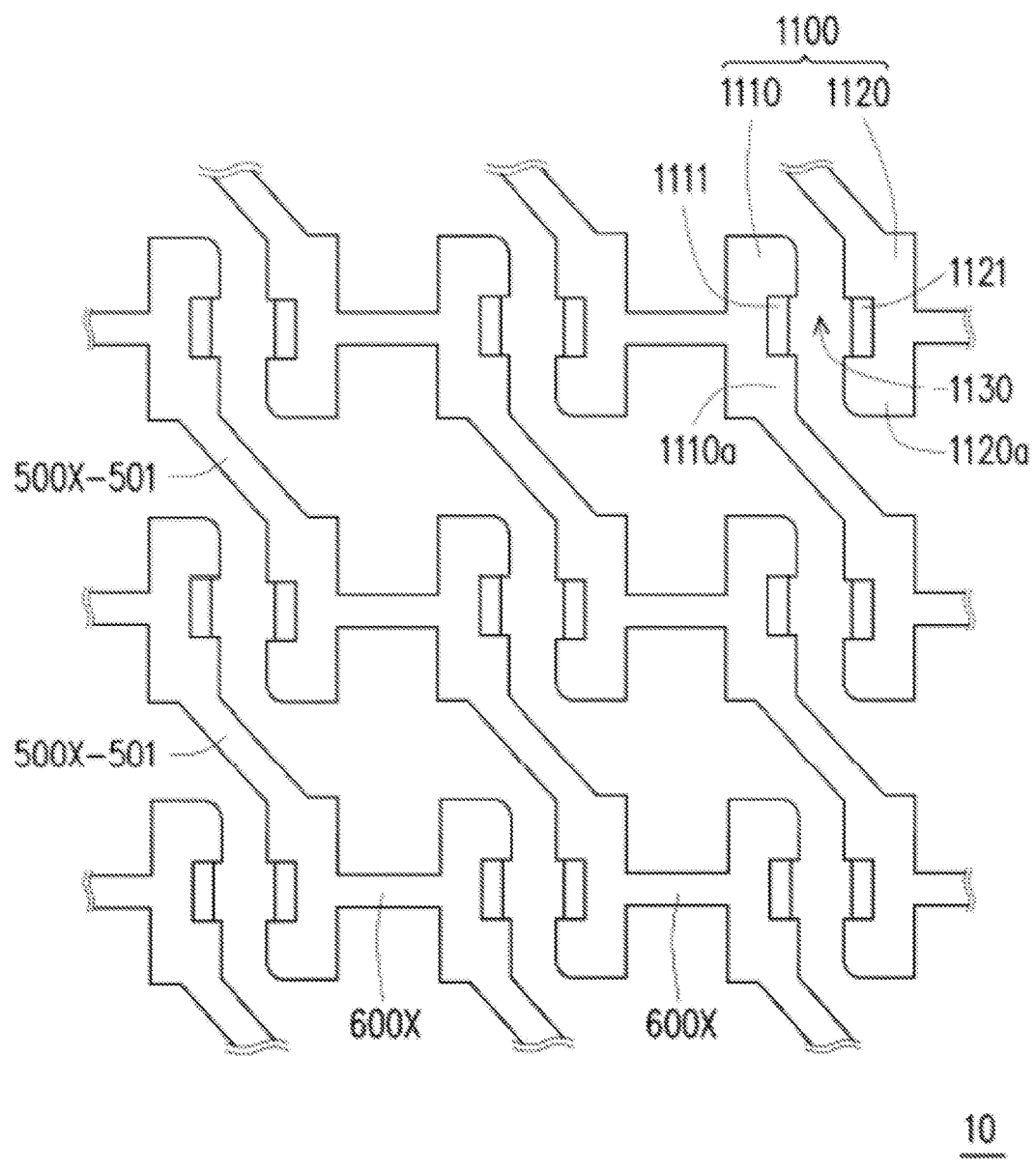
FIG. 12 is a top view of a pad assembly for use in a LED packaging structure according to an embodiment of the present disclosure.

Next please refer to FIG. 12, which is a top view of a pad assembly for use in a LED packaging structure according to an embodiment of the present disclosure. The pad assembly for scale packaging structure may be disposed in the LED packaging structures 1 to 5 as described above, and may also be used in the manufacturing method as described above for mass production of the LED packaging structures. Thus, for the technical content of the pad assembly for use in a LED packaging structure, reference may be made to the technical content of the LED packaging structures 1 to 5 and the manufacturing method thereof.

The pad assembly 10 for use in a LED packaging structure of this embodiment may comprise a plurality of metal pads 1100, a plurality of longitudinal connectors 500X and a plurality of horizontal connectors 600X. The metal pads 1100, the longitudinal connectors 500X and the horizontal connectors 600X may be formed integrally, i.e., may be formed at the same time from a metal plate (not shown) through a punching or etching process.

In the present disclosure, the base material of the pad assembly 10 may for example be copper, iron, aluminum, or an alloy thereof. The first top surface 1110a/the second top surface 1120a and the first bottom surface 1110b/the second bottom surface 1120b may be covered with a protective metal layer. The first concave 1111 and the second concave 1121 may also be or may not be covered with a protective metal layer, and are preferably covered with the protective metal layer to protect the concave portions from being oxidized and thereby reduce the conductivity.

The metal pads 1100 are arranged at regular intervals in a matrix, i.e., when the pad assembly 10 is observed from right above, the metal pads 1100 are arranged continuously in a longitudinal direction (the front-back direction) and a horizontal direction (the left-right direction), i.e., each metal pad 1100 has adjacent metal pads 1100 in both the longitudinal direction and the horizontal direction.

Each of the metal pads 1100 has a first pad portion 1110, a second pad portion 1120 and a gap 1130, and the gap 1130 is disposed between the first pad portion 1110 and the second pad portion 1120. Each first pad portion 1110 has a first top surface 1110a and a first concave 1111 disposed on the first top surface 1110a, and each second pad portion 1120 has a second top surface 1120a and a second concave 1121 disposed on the second top surface 1120a.

Each of the longitudinal connectors 500X connects two of the metal pads 1100 that are adjacent to each other in the longitudinal direction. That is, when the pad assembly 10 is observed from right above, the longitudinal connector 500X connects two metal pads 1100 that are adjacent to each other in the front-back direction.

Each of the longitudinal connectors 500X has a first connecting sheet 501, and when each longitudinal connector 500X connects two metal pads 1100 that are adjacent to each other in the longitudinal direction, one end of the first connecting sheet 501 is connected to the first pad portion 1110 of one of the two metal pads 1100, and the other end of the first connecting sheet 501 is connected to the second pad portion 1120 of the other one of the two metal pads 1100. For example, one end (the front end) of the first connecting sheet 501 is connected to the back side surface of the first pad portion 1110 of a front metal pad 1100, and the other end (the back end) of the first connecting sheet 501 is connected to the front side surface of the second pad portion 1120 of a back metal pad 1100.

Each of the horizontal connectors 600X connects two of the metal pads 1100 that are adjacent to each other in the horizontal direction. That is, when the pad assembly 10 is observed from right above, the horizontal connector 600X connects two metal pads 1100 that are adjacent to each other in the left-right direction. For example, one end (the right end) of the horizontal connector 600X is connected to the left side surface of the first pad portion 1110 of a metal pad 1100 located on the right, and the other end (the left end) of the horizontal connector 600X is connected to the right side surface of the second pad portion 1120 of another metal pad 1100 located on the left. Preferably, the horizontal connector 600X may be implemented as a connecting sheet.

Figure 13:
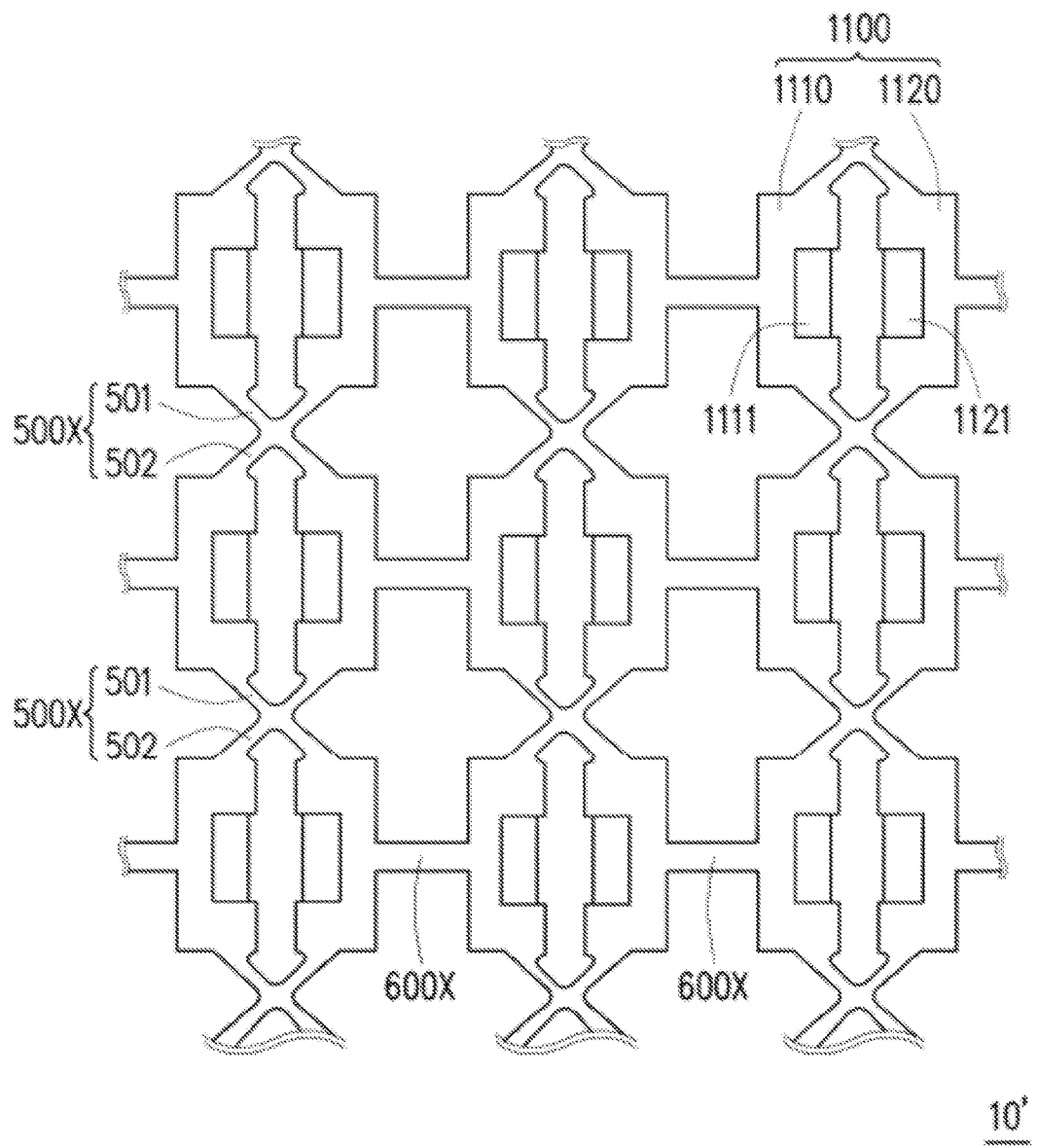
FIG. 13 is a top view of a pad assembly for use in a LED packaging structure according to another embodiment of the present disclosure.

Next please refer to FIG. 13, which is a top view of a pad assembly for use in a LED packaging structure according to another embodiment of the present disclosure. A pad assembly 10' of an eighth embodiment is similar to the pad assembly 10 of the first embodiment, and the difference therebetween at least lies in that: each of the longitudinal connectors 500X may has a second connecting sheet 502. Specifically, when each longitudinal connector 500X connects two metal pads 1100 that are adjacent to each other in the longitudinal direction, one end of the second connecting sheet 502 is connected to the second pad portion 1120 of one of the two metal pads 1100, and the other end of the second connecting sheet 502 is connected to the first pad portion 1110 of the other one of the two metal pads 1100.

For example, one end (the front end) of the second connecting sheet 502 is connected to the back side surface of the second pad portion 1120 of a front metal pad 1100, and the other end (the back end) of the second connecting sheet 502 is connected to the front side surface of the first pad portion 1110 of another back metal pad 1100. Therefore, in this embodiment, the first connecting sheet 501 and the second connecting sheet 502 may cross each other to form an X shape. Preferably, the first connecting sheet 501 and the second connecting sheet 502 may be formed integrally.

Because the first connecting sheet 501 and the second connecting sheet 502 connect the metal pads 1100 in a cross manner in the longitudinal direction, the connection strength between the metal pads 1100 may be improved. That is, the metal pads 1100 will not be easily bent as a whole so that the first pad portion 1110 and the second pad portion 1120 of each metal pad 1100 will not easily shift with respect to each other. When the first pad portion 1110 and the second pad portion 1120 do not easily shift with respect to each other, the ESD protection element or the LED chip (not shown) will not be easily separated from the metal pad 1100.

The above description describes the pad assemblies 10 and 10' according to the embodiments of the present disclosure, and as can be known from the above description, the pad assemblies 10 and 10' connect a plurality of metal pads, each having a first concave and a second concave disposed thereon, through the longitudinal connectors and the horizontal connectors to achieve the mass production of the LED packaging structures provided with the ESD protection elements.

According to the above descriptions, the LED packaging structure, the manufacturing method thereof and the pad assembly for use in the LED packaging structure disclosed by the embodiments of the present disclosure at least have the following features: the ESD protection element may be disposed within the concaves of the metal pad so that, after the LED chip is disposed, only the metal pad and the LED chip can be seen when the LED packaging structure is observed from right above, and the LED packaging structure may have a reduced size and relatively good resistance to ESD.

Figure 14:
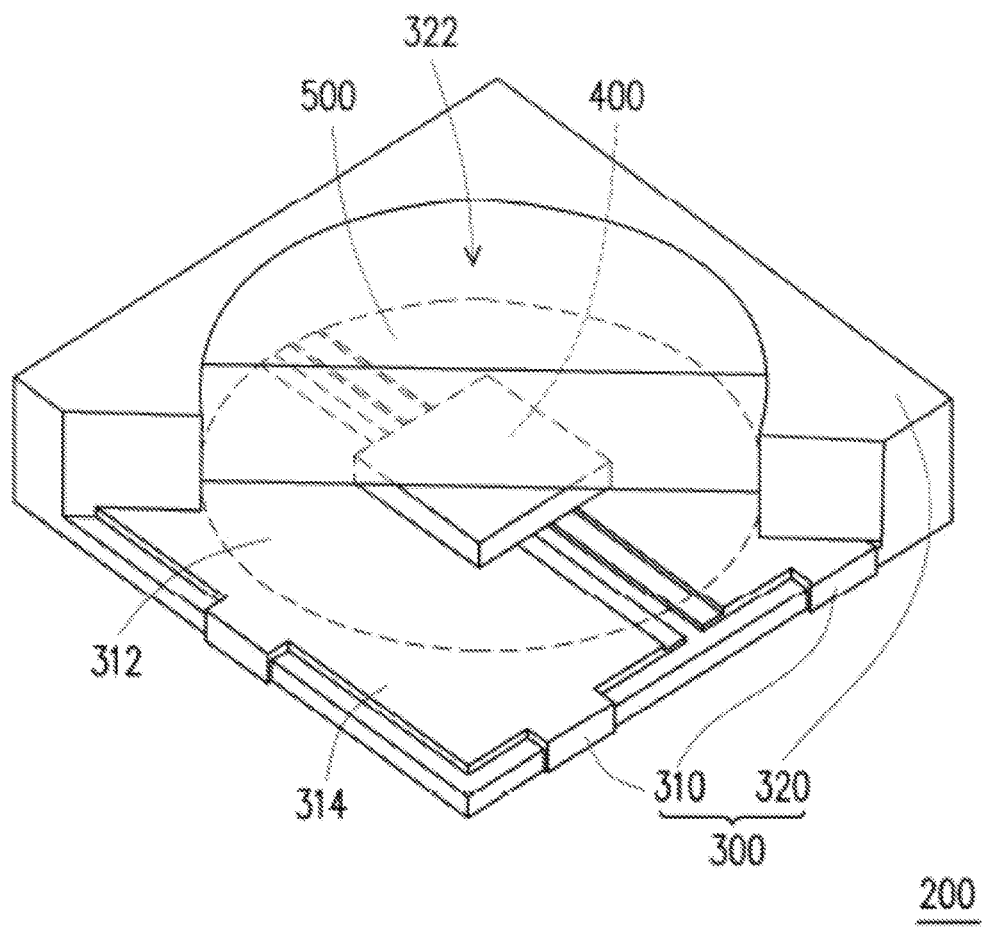
FIG. 14 is a schematic perspective view of a frame and a light emitting device having the frame according to an embodiment of the present disclosure, wherein part members are only partially presented for clearly showing the individual members in the drawings.

The present disclosure further provides a frame and a light emitting device having the frame. As shown in FIG. 14, which is a schematic perspective view of a light emitting device according to an embodiment of the present disclosure, part members are only partially presented for clearly showing the individual members in the drawings. A light emitting device 200 of this embodiment comprises a frame 300, an LED chip or a LED packaging structure 400 and a light transmitting encapsulant 500.

It shall be appreciated that, in the light emitting device of the present disclosure, the LED chip and the aforesaid LED packaging structure may be substituted for each other, and any light emitting device comprising the LED chip or the LED packaging structure under the spirit of the present disclosure shall fall within the scope of the present disclosure.

Figure 15:
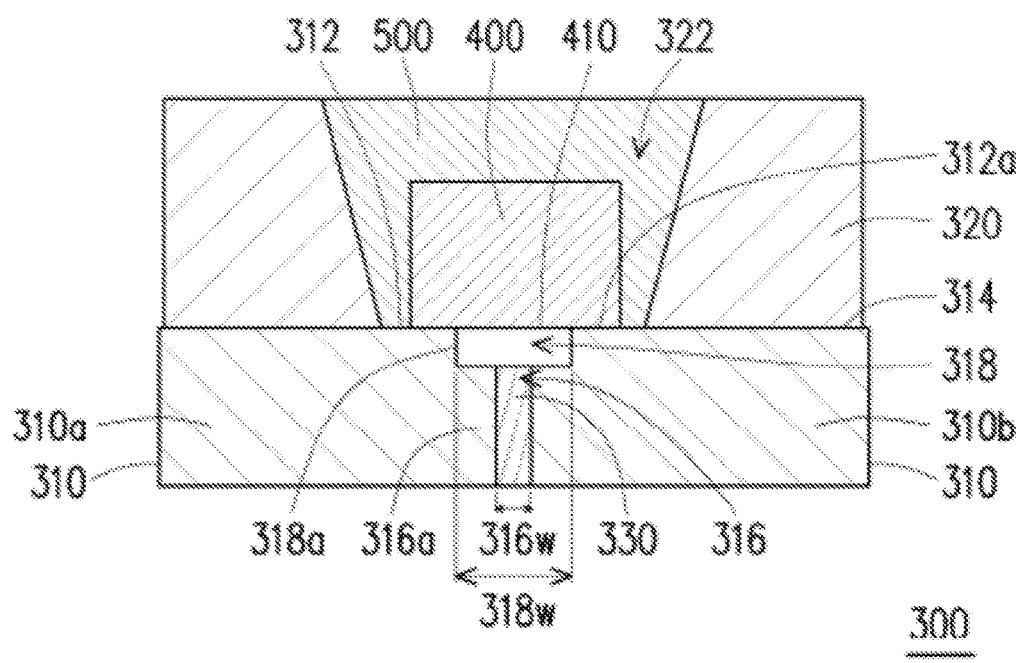
FIG. 15 is a schematic cross-sectional view of a frame according to an embodiment of the present disclosure.

Please refer to the embodiment of the frame 300 shown in FIG. 15 together, the frame 300 comprises a plurality of leads 310 (illustrated as two leads 310 respectively disposed on the left and the right in the figure), a housing 320 and a gap filler 330. As shown in FIG. 15, the leads 310 may be adapted to define a central portion 312 and a peripheral portion 314 surrounding the central portion 312. The central portion 312 has a die bonding surface 312a, and there are a gap 316 and a buffering space 318 between the adjacent leads 310. The housing 320 is disposed on the peripheral portion 314, and the shape of the housing 320 is not particularly limited in the present disclosure as long as it can maintain the integrity of the leads. The housing 320 as shown in FIG. 15 is cup-shaped. The housing 320 is higher than the horizontal height of the lead 310 and covers the peripheral portion 314, and the housing 320 and the central portion 312 may be adapted to define a recessed portion 322 for conveniently containing a light transmitting encapsulant precursor in the liquid state. In this embodiment, the housing 320 may be filled with a reflective material, thereby improving the light emitting effect of the light emitting device. Additionally, the housing 320 may also be flush with or at the same height as the lead 310, in which case the light transmitting encapsulant may be applied to the frame through the mold casting technology or the like. The external edge of the lead 310 may be or may not be in alignment with the external edge of the housing 320. The gap filler 330 is disposed within the gap 316. Furthermore, as shown in FIG. 15, the frame 300 may have the LED chip 400 disposed on the die bonding surface 312a and may have the light transmitting encapsulant 500 disposed within the recessed portion 322. The light transmitting encapsulant 500 may comprise a fluorophore, a diffusant, an anti-settling agent or any combination thereof. The fluorophore used in the aforesaid packaging encapsulant may be selected for use as the fluorophore in the light transmitting encapsulant 500, and this will not be further described herein.

As shown in FIG. 14, the housing 320 is disposed surrounding the LED chip 400, and as shown in FIG. 15, the adjacent leads 310 each has a first side edge 316a and a second side edge 318a. That is, the gap 316 may be defined by the first side edges 316a, the buffering space 318 may be defined by the second side edges 318a, and the buffering space 318 may be adapted to accommodate an expanded volume 332 (as shown in FIG. 16B) of the gap filler 330 that is generated during the packaging process so that the expanded volume 322 is not in contact with a bottom surface 410 of the LED chip 400.

Figure 16A:
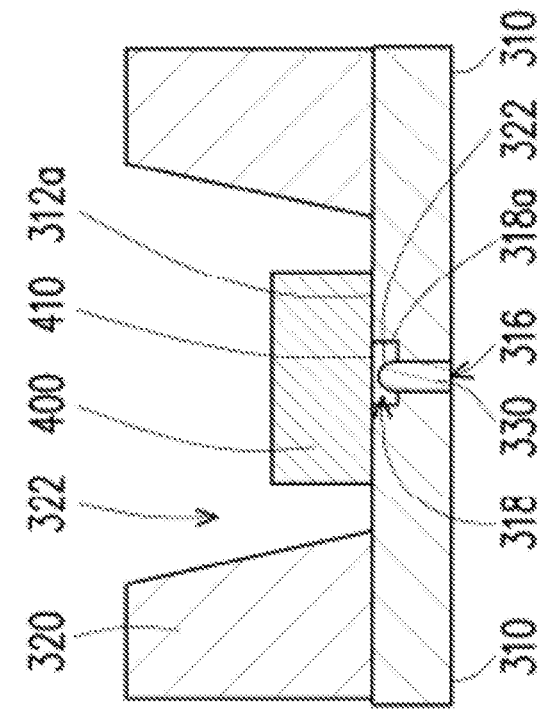
FIG. 16A is a schematic cross-sectional view of a light emitting device according to an embodiment of the present disclosure before it is subjected to the high-temperature die bonding stage.
Figure 16B:
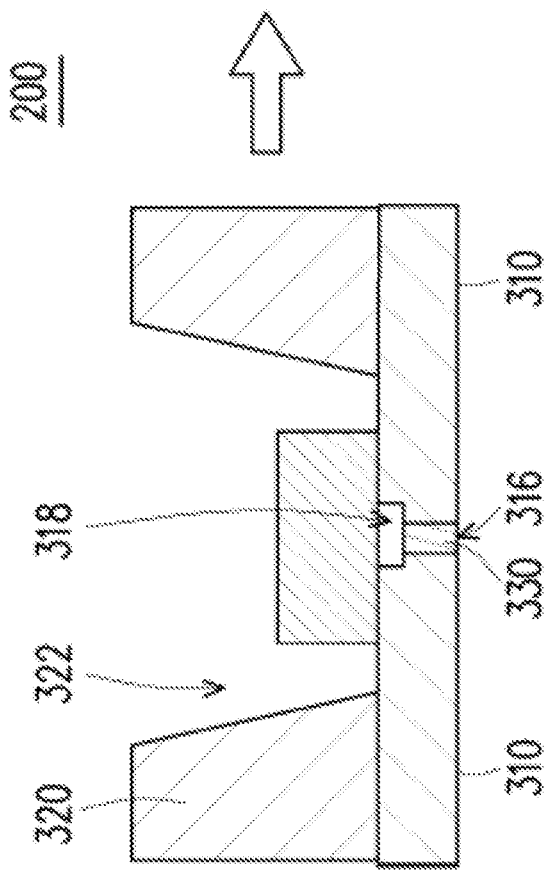
FIG. 16B is a schematic cross-sectional view of a light emitting device according to an embodiment of the present disclosure after it is subjected to the high-temperature die bonding stage.

In detail, as shown in FIG. 16A, before the light emitting device 200 of the present disclosure is subjected to the high-temperature die bonding, the gap filler 330 is stuffed within the gap 316, and preferably, the gap filler 330 is coplanar with the upper opening of the gap 316. Next, as shown in FIG. 16B, when the light emitting device 200 of the present disclosure is subjected to the high-temperature bonding stage, the expanded volume 332 of the gap filler 330 that is generated due to the high temperature will protrude from the gap 316. At this point, because the buffering space 318 defined by two second side edges 318a is disposed above the gap 316, the expanded volume 332 of the gap filler 330 may be accommodated by the buffering space 318 and will not continue to protrude outside the buffering space 318 even if it protrudes from the gap 316.

In other words, the buffering space 318 defined by the aforesaid second side edges 318a is sufficient to accommodate the expanded volume 332 of the gap filler 330 that is generated during the packaging process, thereby avoiding the problem that the eutectic bonding surface between the bottom surface 410 of the LED chip 400 and the lead 310 may be damaged because the expanded volume 332 of the gap filler 330 protrudes outside the gap 316 due to thermal expansion.

In an implementation, the housing 320 and the gap filler 330 are formed integrally, and the gap 316 is located under the buffering space 318.

Please refer to the embodiment shown in FIG. 15 again, in this embodiment, the first side edge 316a of the lead 310 is substantially a vertical side edge, but this is not limiting.

As shown in FIG. 14 and FIG. 15, the leads 310 preferably includes two leads 310, and the two leads 310 may be a first electrode portion 310a and a second electrode portion 310b. When the bottom surface 410 of an LED chip 400 is bonded to the die bonding surface 312a, the first electrode portion 310a and the second electrode portion 310b may be adapted to be in electrical communication with each other.

Moreover, in the frame 300 of the present disclosure, the coefficient of thermal expansion of the gap filler 330 is larger than that of the lead 310. Thus, the height of the buffering space 318 needs to be larger than the height difference before and after the expanded volume of the gap filler 330 is generated. Preferably, a vertical height of the buffering space 318 ranges between 20% and 40% of the height of the gap filler 330 to help effectively ensure that the expanded volume 332 of the gap filler 330 will not protrude outside the buffering space 318.

Figure 17:
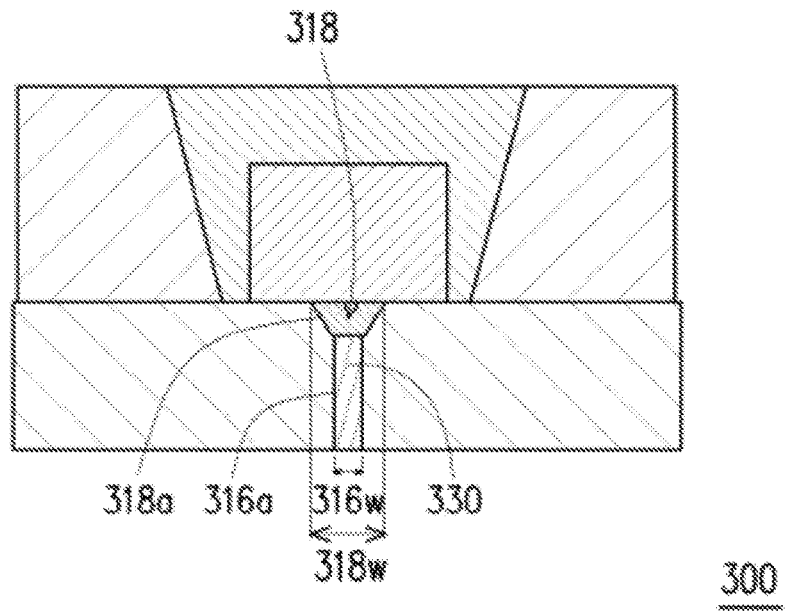
FIG. 17 is a schematic cross-sectional view of a frame according to another embodiment of the present disclosure.
Figure 18:
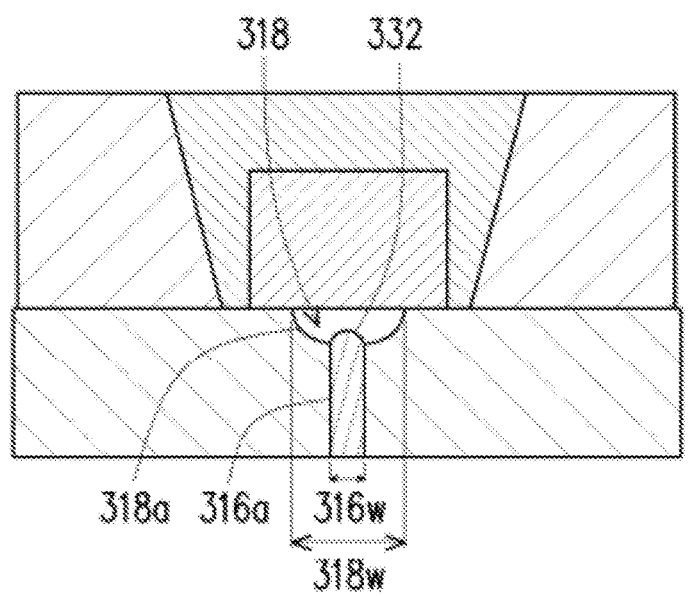
FIG. 18 is a schematic cross-sectional view of a frame according to a further embodiment of the present disclosure.

Still referring to FIG. 14 and FIG. 15, in the embodiment of the frame 300 comprised in the light emitting device 200 of the present disclosure, the cross section of the buffering space 318 is preferably a rectangle. However, in other embodiments, the cross section of the buffering space 318 may also have other patterns. For example, in another embodiment of the frame 300 as shown in FIG. 17, the cross section of the buffering space 318 is a trapezoid that is wide at the top and narrow at the bottom. However, in a further embodiment of the frame 300 as shown in FIG. 18, the cross section of the buffering space 318 is a recessed and curved surface. Moreover, in the subsequent packaging process, the buffering space 318 may optionally be filled or not filled with the light transmitting encapsulant 500. In the implementation as shown in FIG. 15, the buffering space 318 is not filled with the light transmitting encapsulant 500, so the amount of the encapsulant required may be reduced. In another implementation as shown in FIG. 17, the buffering space 318 is filled with the light transmitting encapsulant 500, and the heat dissipating efficiency may be increased due to the light transmitting encapsulant 500 in the buffering space 318.

Figure 19:
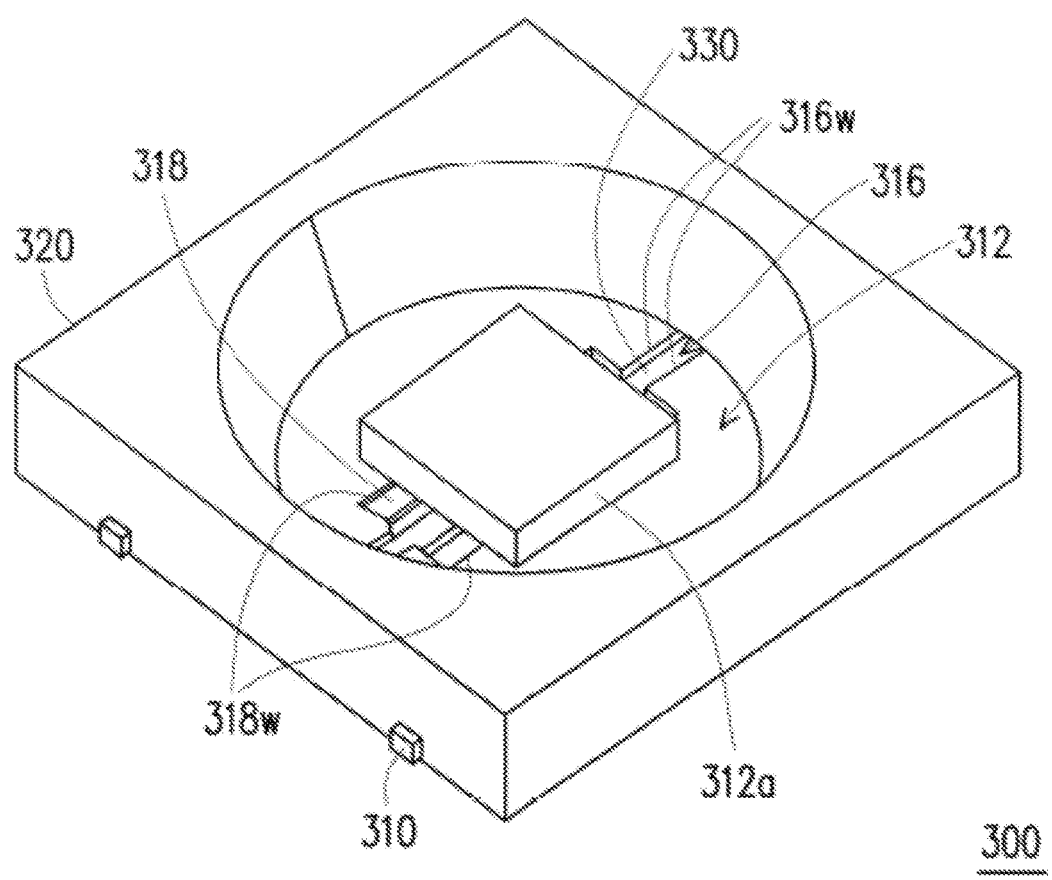
FIG. 19 is a schematic perspective view of a frame according to yet another embodiment of the present disclosure.

In the present disclosure, the buffering space 318 is located in the central region 312. However, the buffering space 318 may also extend into the whole or a part of the peripheral portion 314. In the embodiment of the frame 300 as shown in FIG. 14 and FIG. 15, the buffering space 318 extends across the whole lead 310. In another embodiment of the frame 300 as shown in FIG. 19, the buffering space 318 is only located in the central region 312 and preferably located under the die bonding surface 312a. As in another embodiment (not shown) of the present disclosure, the buffering space 318 is located in the whole central region 312 and a part of the peripheral portion 314, and thereby the adhesive area between the housing 320 and the frame 300 may be increased to increase the adhesive force therebetween.

Additionally, in the present disclosure, the gap 316 has a first width 316w, the buffering space 318 has a second width 318w, and the first width 316w of the gap 316 is smaller than the second width 318w of the buffering space 318. The gap 316 may be fully filled with the gap filler 330, and thereby the adhesive area between the gap filler 330 and the lead 310 may be increased to increase the adhesive force therebetween. However, the gap 316 may also be partially filled with the gap filler 330 to form a void region, and thereby the light transmitting encapsulant 500 to be applied subsequently may be stuffed into the void region to increase the adhesive force between the light transmitting encapsulant 500 and the frame 300.

Figure 20:
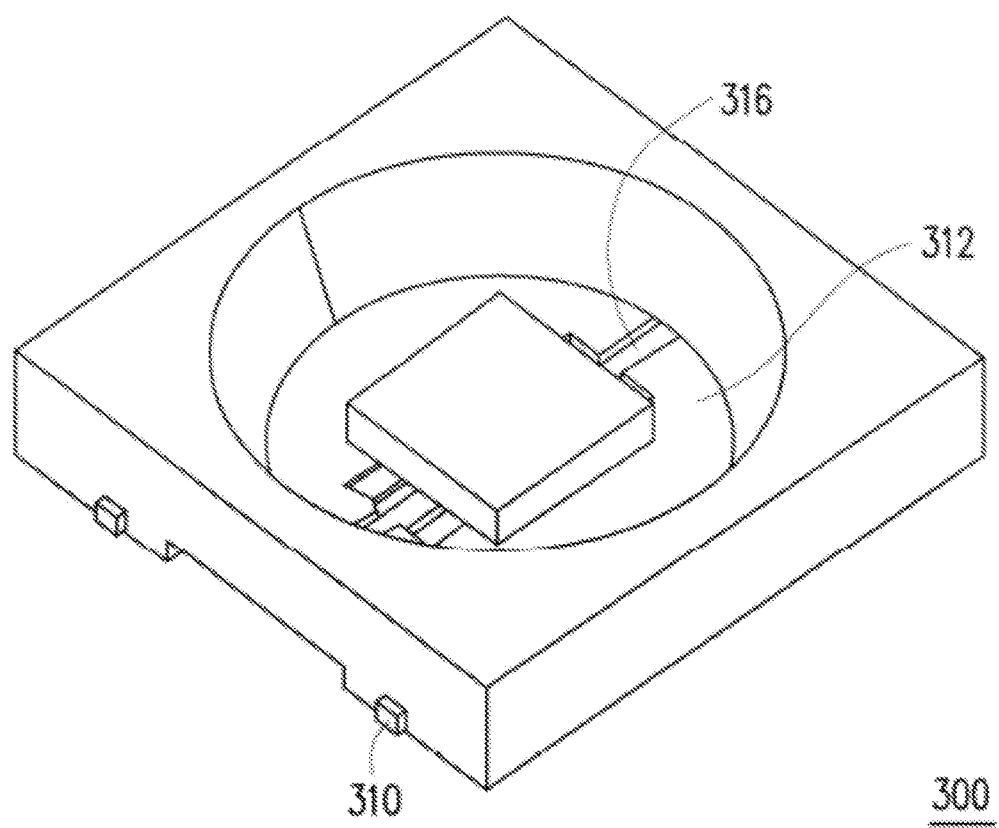
FIG. 20 is a schematic perspective view of a frame according to yet a further embodiment of the present disclosure.
Figure 21:
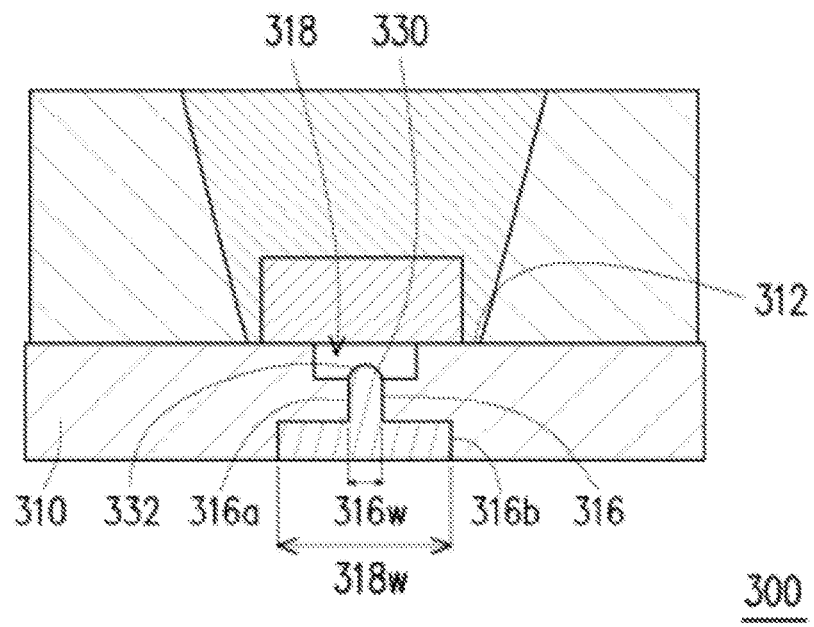
FIG. 21 is a schematic cross-sectional view of a frame according to yet another embodiment of the present disclosure.

In yet another embodiment of the frame 300 shown in FIG. 20 and FIG. 21, the leads 310 are further provided with a concaved portion 316b under the gap 316, and the concaved portion 316b has a third width 316b w so that the first width 316w of the gap 316 is smaller than the third width 316b w of the concaved portion 316b and the concaved portion 316b is filled with the gap filler 330, thereby increasing the bonding surface area between the gap filler 330 and the leads 310 at two sides to achieve the objective of enhancing the structural strength of the frame 300.

It shall be appreciated that, the location of the aforesaid concaved portion 316b may be disposed as follows: (1) the whole concaved portion 316b is relatively disposed under the central portion 312 of the lead 310; (2) the whole concaved portion 316b is relatively disposed under the peripheral portion 314 of the lead 310; or (3) one part of the concaved portion 316b is disposed under the central portion 312 of the lead 310, and the other part of the concaved portion 316b is relatively disposed under the peripheral portion 314 of the lead 310.

Figure 22:
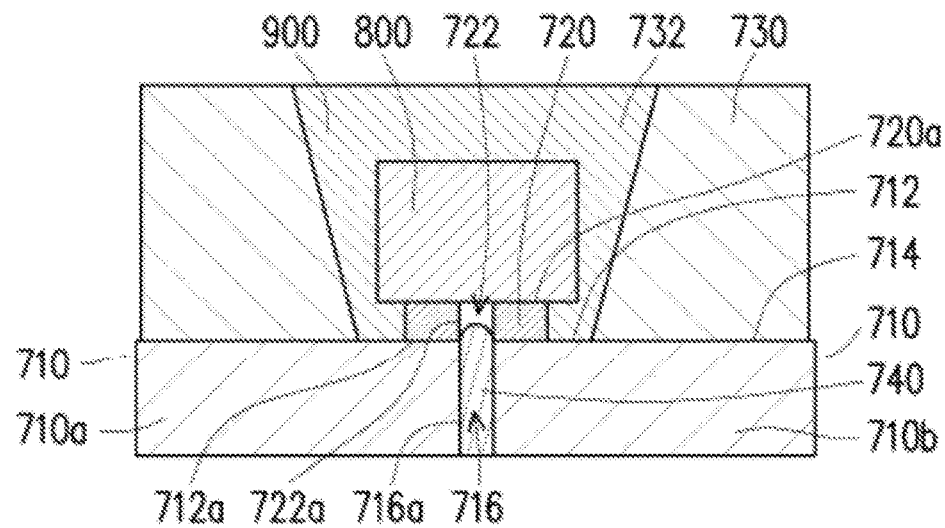
FIG. 22 is a schematic cross-sectional view of a light emitting device and a frame according to yet another embodiment of the present disclosure.

As shown in FIG. 22, the light emitting device 600 of the present disclosure comprises a frame 700, an LED chip 800 and a light transmitting encapsulant 900.

As shown in FIG. 22, the frame 700 comprises a plurality of leads 710, a plurality of bumps 720, a housing 730 and a gap filler 740. The leads 710 may be adapted to define a central portion 712 and a peripheral portion 714 surrounding the central portion 712, the central portion 712 has a die bonding surface 712a, and there is a gap 716 between adjacent leads 710. The bumps 720 are disposed on the leads 710 and have a die bonding surface 720a, and there is a buffering space 722 between adjacent bumps 720 on the leads 710. The housing 730 is disposed on the peripheral portion 714, and the housing 730 and the central portion 712 may be adapted to define a recessed portion 732. The gap filler 740 is disposed within the gap 716.

The housing 730 is disposed surrounding the LED chip 800, the adjacent leads 710 each has a first side edge 716a, and the adjacent bumps 720 each has a second side edge 722a so that the gap 716 is defined by the first side edges 716a, and the buffering space 722 is defined by the second side edges 722a. In this way, the buffering space 722 may be adapted to accommodate an expanded volume 742 of the gap filler 740 that is generated during the packaging process so that the expanded volume 742 is not in contact with a bottom surface 810 of the LED chip 800.

Moreover, the aforesaid LED chip 800 is disposed on the die bonding surface 712a of the central portion 712, and in this embodiment, the light transmitting encapsulant 900 is disposed within the recessed portion 732.

In this way, as shown in FIG. 22, similar to the aforesaid frame 300, the gap filler 740 is stuffed within the gap 716 before the light emitting device 600 of the present disclosure is subjected to the high-temperature die bonding, and the expanded volume 742 of the gap filler 740 that is generated due to the high temperature will protrude from the gap 716 after the light emitting device 600 of the present disclosure is subjected to the high-temperature die bonding stage. At this point, because the buffering space 722 defined by two second side edges 722a of the bumps 720 is disposed above the gap 716, the expanded volume 742 of the gap filler 740 may be accommodated by the buffering space 722 and will not continue to protrude outside the buffering space 722 even if it protrudes from the gap 716, and meanwhile, the expanded volume 742 will not be in contact with or push against the bottom surface 810 of the LED chip 800.

Therefore, the buffering space 722 defined by the aforesaid second side edges 722a is sufficient to accommodate the expanded volume 742 of the gap filler 740 that is generated during the packaging process, thereby avoiding the problem that the bonding surface between the bottom surface 810 of the LED chip 800 and the bump 720 may be damaged because the expanded volume 742 of the gap filler 740 protrudes outside the gap 716 due to thermal expansion.

In an embodiment, the housing 730 and the gap filler 740 are formed integrally, and the gap 716 is located under the buffering space 722.

Figure 23:
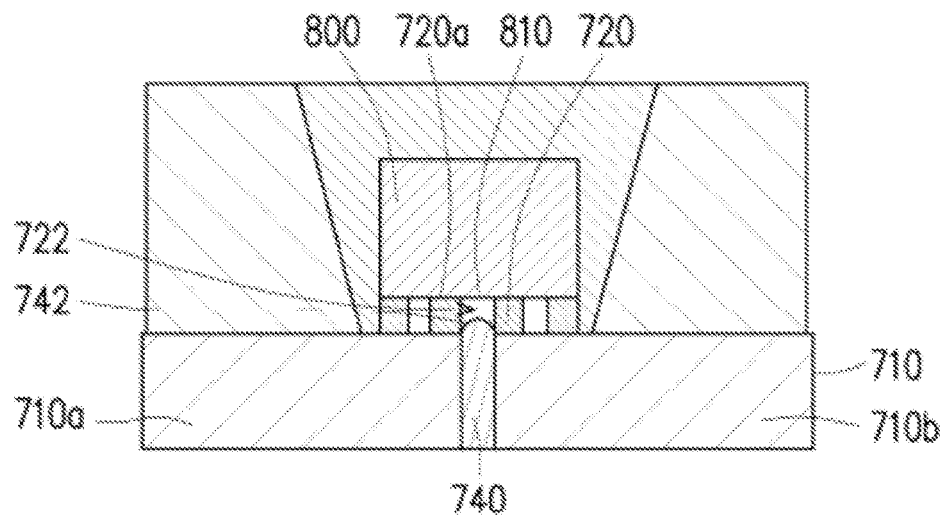
FIG. 23 is a schematic cross-sectional view of a light emitting device and a frame according to yet another embodiment of the present disclosure.

As shown in FIG. 23, the leads 710 preferably includes two leads 710, and the two leads 710 may be a first electrode portion 710a and a second electrode portion 710b. When the bottom surface 810 of an LED chip 800 is bonded to the die bonding surface 720a, the first electrode portion 710a and the second electrode portion 710b may be adapted to be in electrical communication with each other.

Moreover, in the light emitting device 600 of the present disclosure, the coefficient of thermal expansion of the gap filler 740 is larger than that of the lead 710. Thus, the height of the buffering space 722 needs to be larger than the height difference before and after the expanded volume 742 of the gap filler 740 is generated. Preferably, a vertical height of the buffering space 722 ranges between 20% and 40% of the height of the gap filler 740 to help effectively ensure that the expanded volume 742 of the gap filler 740 will not protrude outside the buffering space 722.

In the embodiment of the frame 700 shown in FIG. 23, the structure of the frame 700 is generally similar to that of the embodiment shown in FIG. 22. The main difference between the embodiment of FIG. 23 and the embodiment of FIG. 22 lies in that: in the embodiment of FIG. 23, the buffering space 722 is defined by bumps 720 of which the quantity and the shape are different from those of the embodiment of FIG. 22. However, the embodiment of FIG. 23 can also have the effect of providing the buffering space 722 for the expanded volume 742 of the gap filler 740 so that the expanded volume 742 of the gap filler 740 will not be in contact with or push against the bottom surface 810 of the LED chip 800.

Figure 24:
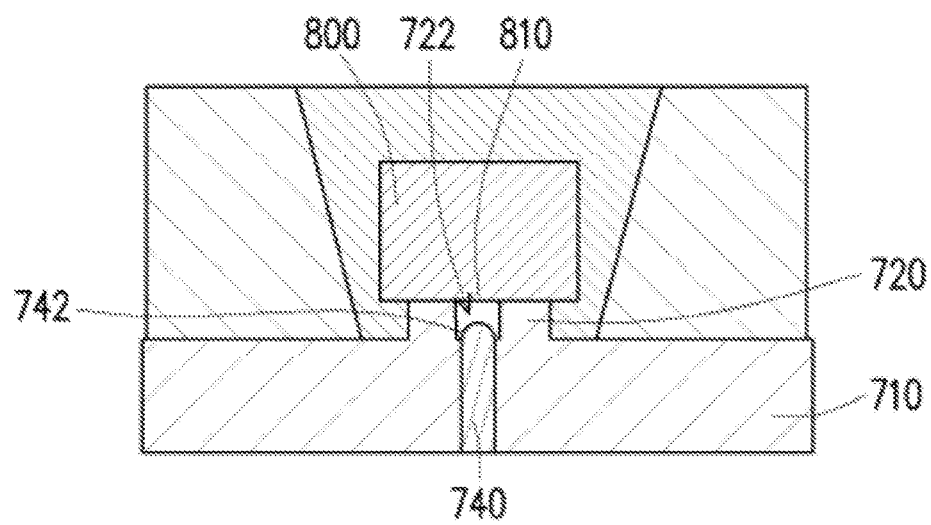
FIG. 24 is a schematic cross-sectional view of a light emitting device and a frame according to a further embodiment of the present disclosure.

In another embodiment of the frame 700 shown in FIG. 24, the structure of the frame 700 is generally similar to that of the embodiment shown in FIG. 22. The main difference between the embodiment of FIG. 24 and the embodiment of FIG. 22 lies in that: in the embodiment shown in FIG. 24, the bumps 720 are respectively formed integrally with the leads 710 below, thereby providing the buffering space 722 for the expanded volume 742 of the gap filler 740 so that the expanded volume 742 of the gap filler 740 will not be in contact with or push against the bottom surface 810 of the LED chip 800 due to thermal expansion.

Figure 25:
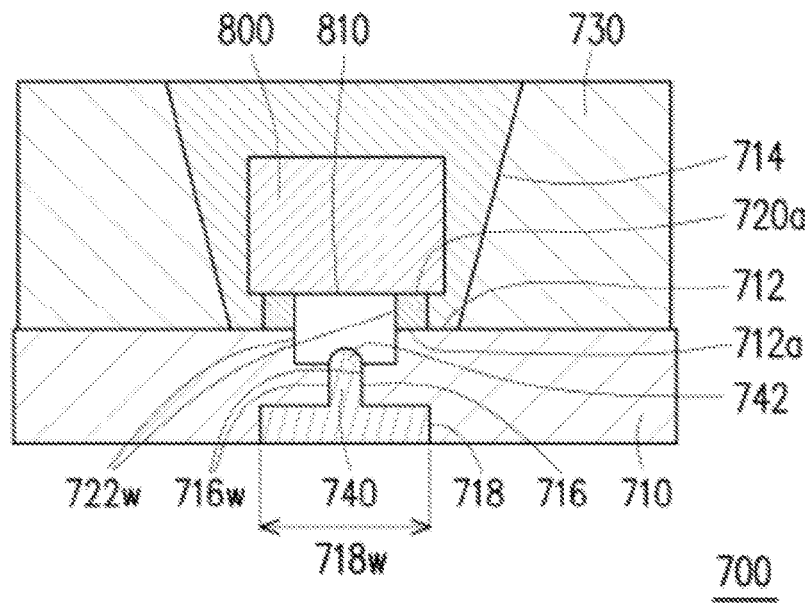
FIG. 25 is a schematic cross-sectional view of a light emitting device and a frame according to yet another embodiment of the present disclosure.

Additionally, in the embodiment of the frame 700 shown in FIG. 25, the structure of the frame 700 is generally similar to that of the embodiment shown in FIG. 22. The main difference between the embodiment of FIG. 25 and the embodiment of FIG. 22 lies in that: in the embodiment shown in FIG. 25, the buffering space 722 may extend downward to have a bottom surface lower than the die bonding surface 712a of the central portion 712, thereby providing the buffering space 722 for the expanded volume 742 of the gap filler 740 so that the expanded volume 742 of the gap filler 740 will not be in contact with or push against the bottom surface 810 of the LED chip 800 due to thermal expansion.

Similar to the aforesaid frame 300, the cross section of the buffering space 722 comprised in the frame 700 may preferably be a rectangle, a trapezoid that is wide at the top and narrow at the bottom or other shapes, and this is not limited in the present disclosure.

Likewise, similar to the aforesaid frame 300, the gap 716 of the frame 700 has a first width 716w, the buffering space 722 has a second width 722w, and the first width 716w of the gap 716 is smaller than or equal to the second width 722w of the buffering space 722 to further reduce the possibility that the expanded volume 742 of the gap filler 740 might be in contact with or push against the bottom surface 810 of the LED chip 800 due to thermal expansion.

Likewise, similar to the aforesaid frame 300, the leads 710 of the frame 700 are further provided with a concaved portion 718 under the gap 716, and the concaved portion 718 has a third width 718w so that the first width 716w of the gap 716 is smaller than the third width 718w of the concaved portion 718 and the concaved portion 718 is filled with the gap filler 740, thereby increasing the bonding surface area between the gap filler 740 and the leads 710 at two sides to achieve the objective of enhancing the structural strength of the frame 700.

It shall be appreciated that, the location of the aforesaid concaved portion 718 may be disposed as follows: (1) the whole concaved portion 718 is relatively disposed under the central portion 712 of the lead 710; (2) the whole concaved portion 718 is relatively disposed under the peripheral portion 714 of the lead 710; or (3) one part of the concaved portion 718 is disposed under the central portion 712 of the lead 710, and the other part of the concaved portion 718 is relatively disposed under the peripheral portion 714 of the lead 710.

Furthermore, both the LED chip 400 in the light emitting device 200 and the LED chip 800 in the light emitting device 600 are flip chips in the present disclosure.

Figure 26:
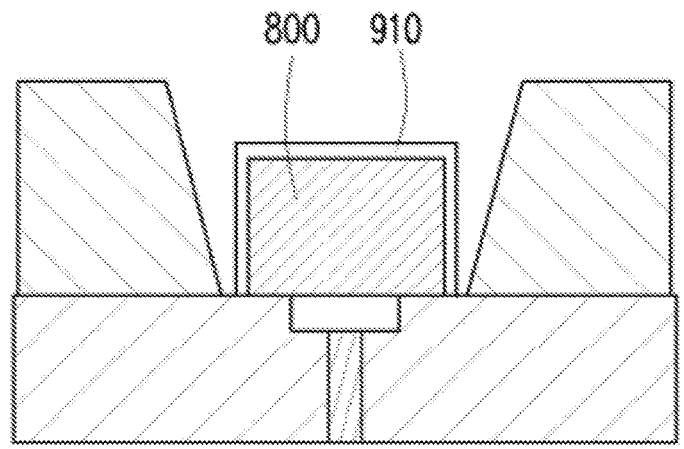
FIG. 26 is a schematic cross-sectional view of a light emitting device and a frame according to yet a further embodiment of the present disclosure.

As described above, in the light emitting device using the frame of the present disclosure, the LED chip may be replace by a LED packaging structure, preferably the LED packaging structure as describe above. As shown in FIG. 26, in another implementation, the light emitting device 600 has a LED packaging structure (which may be for example one of the LED packaging structures of the aforesaid embodiments). That is, the external surface of the LED chip 800 in the frame 700 may be covered with a packaging encapsulant 910, and the packaging encapsulant 910 comprises a fluorophore or a fluorophore ceramic layer so that the LED chip 800, after being covered with the packaging encapsulant 910, has the mixed light-emitting effect instead of only being capable of emitting light of one color. Meanwhile, the packaging encapsulant 910 may also provide the effect of protecting the LED chip 800.

It shall be noted that, in the light emitting device using the frame of the present disclosure, the aspect of the LED packaging structure is not limited. For example, the aforesaid packaging encapsulant 910 is directly formed as a thin film to be adhered to the surface of the LED chips 400/800, and the packaging encapsulant 910 may be a mixture of the fluorophore and the encapsulant or it is directly a ceramic layer simply made of the fluorophore. Moreover, a light transmitting encapsulant (not shown) may be further applied on the packaging encapsulant 910 to provide additional protection.

Moreover, the LED chips 400/800 or the LED packaging structure (e.g., one of the LED packaging structures 1 to 5 of the aforesaid embodiments) are respectively disposed on the die bonding surfaces 312*a*/712*a* through direct bonding, eutectic bonding, golden ball bonding and conductive adhesives bonding.

On the other hand, both the light transmitting encapsulant 500 in the light emitting device 200 and the light transmitting encapsulant 900 in the light emitting device 600 comprise epoxy-based resin, silicon-based resin, polyurethane-based resin or any combination thereof, and the light transmitting encapsulants 500/900 comprise a fluorophore, a diffusant, an anti-settling agent or any combination thereof.

In an implementation of the present disclosure, the light emitting devices 200/600 may further comprise a Zener diode, a thermistor and/or a fuse.

According to the above descriptions, owing to the arrangement of the buffering space defined by the leads or the bumps of the light emitting device in this application, the problem that the eutectic bonding surface between the bottom surface of the LED chip and the lead may be damaged because the expanded volume of the gap filler protrudes outside the gap due to thermal expansion when the gap filler is subjected to the high-temperature eutectic bonding may be effective avoided. Moreover, by disposing the concaved portion under the gap and filling the concaved portion with the gap filler, the bonding surface area between the gap filler and the leads at two sides may be further increased to achieve the effect of enhancing the structural strength of the frame.

The present disclosure further provides a light emitting device having the omni-directional light emitting effect and a manufacturing method thereof, wherein the LED chip/the LED packaging structure are disposed at two sides of the substrate. The light emitting device having the omni-directional light emitting effect of the present disclosure will be described with reference to the drawings hereinafter.

Figure 27:
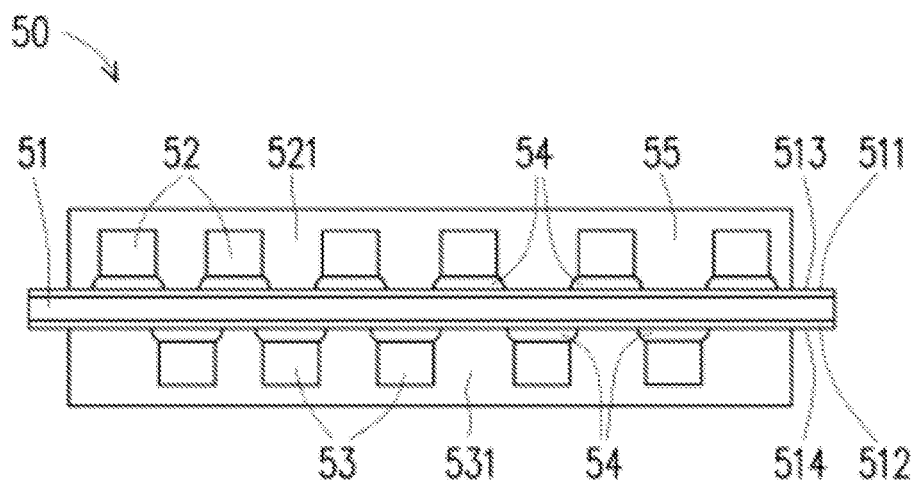
FIG. 27 is a side view of a light emitting device according to an embodiment of the present disclosure.

Please refer to FIG. 27, which is a side view of a light emitting device according to an embodiment of the present disclosure. The light emitting device 50 may comprise a substrate 51, a plurality of first LED chips/LED packaging structures 52 and a plurality of second LED chips/LED packaging structures 53. The substrate 51 has a first surface 511 and a second surface 512 that are opposite to each other. The first surface 511 has a first circuit pattern 513 disposed thereon, and the second surface 512 has a second circuit pattern 514 disposed thereon.

The first LED chips 52 are disposed on the first surface 511 and are electrically connected to the first circuit pattern 513, and the second LED chips 53 are disposed on the second surface 512 and are electrically connected to the second circuit pattern 514. Moreover, each of the second LED chips 53 is located above (i.e., right above) a gap 521 between two adjacent first LED chips 52. Thereby, the light emitting device 50 can emit light towards two directions to provide omni-directional light.

The substrate 51 may be any plate structure that may be provided with a circuit pattern such as a glass substrate, a sapphire substrate, a metal substrate or a plastic substrate, wherein the metal substrate may comprise a metal base and two insulating layers (not shown) respectively disposed above and below the metal base.

Preferably, the first LED chips/the LED packaging structures 52 and the second LED chips/the LED packaging structures 53 are electrically connected to the first circuit pattern 513 and the second circuit pattern 514 respectively via an anisotropic conductive adhesive 54. Thereby, the first LED chips/the LED packaging structures 52 and the second LED chips/the LED packaging structures 53 can be electrically connected with external circuits reliably.

The light emitting device 50 may further comprise a protective encapsulant 55, and the protective encapsulant 55 is disposed on the first surface 511 and the second surface 512 and covers the first LED chips/the LED packaging structures 52 and the second LED chips/the LED packaging structures 53. Thereby, the first LED chips/the LED packaging structures 52 and the second LED chips/the LED packaging structures 53 can be protected by the protective encapsulant 55. The protective encapsulant 55 may also be used to adjust the color of the light rays emitted by the first LED chip 52 and the second LED chip 53. Therefore, the protective encapsulant 55 may be a transparent encapsulant or a fluorescent encapsulant (a mixture of the fluorophore and the encapsulant). The fluorophore used in the aforesaid packaging encapsulant may be selected for use as the fluorophore in the protective encapsulant 55.

Moreover, in the light emitting device 50, no reflective layer is disposed on the first surface 511 in the gap 521 between two adjacent first LED chips/LED packaging structures 52, and no reflective layer is disposed on the second surface 512 in a gap 531 between two adjacent second LED chips/LED packaging structures 53. In other words, the arrangement of the "reflective layer" is eliminated in the light emitting device 50. Thereby, the light rays emitted by the light emitting device 50 have relatively good light patterns. The width of the gap 531 is larger than or equal to the width of the first LED chips/the LED packaging structures 52, and the width of the gap 521 is larger than or equal to the width of the second LED chips/the LED packaging structures 53. Thereby, the first LED chips/the LED packaging structures 52 and the second LED chips/the LED packaging structures 53 can be completely staggered instead of being overlapped with each other so that the back light of the first LED chips/the LED packaging structures 52 and the second LED chips/the LED packaging structures 53 will not be blocked by each other, thereby avoiding the decrease in the light emitting efficiency. Meanwhile, the heat accumulation in the otherwise overlapped section may be avoided and the risk of chip failure is reduced.

Figure 28:
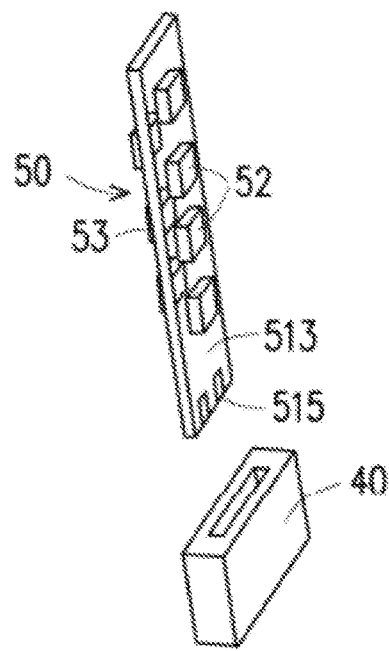
FIG. 28 is a schematic view of a light emitting device connected to a connector according to an embodiment of the present disclosure.

It shall be additionally appreciated that, referring to FIG. 27 and FIG. 28, part regions (e.g., the left and right sides) of the first surface 511 and the second surface 512 of the substrate 51 are not provided with the protective encapsulant 55 so that the first circuit pattern 513 or the second circuit pattern 514 on these regions has a part that is not covered by the protective encapsulant 55 to serve as the connecting point with an external circuit (i.e., a electrode pad 515). Thereby, one end of the light emitting device 50 may be directly connected to a connector 40 or a lamp socket (not shown) so that the electrode pad 515 in this end is in contact with the contact (not shown) in the connector 40 or the lamp socket, and thereby the electrical energy from the connector 40 can be supplied to the LED chips/the LED packaging structures 52 and 53.

Additionally, the light emitting device 50 may be applied to any occasions with lighting demands. For example, the light emitting device 50 may be applied in a bulb (i.e., disposed inside the shell of the bulb to serve as the filament of the bulb), and then the bulb is installed into a general lighting apparatus (not shown). Alternatively, the light emitting device 50 may be directly installed into the general lighting apparatus. In this case, the electrode pad 515 of the light emitting device 50 may be electrically connected with the connector of the lighting apparatus.

The above disclosure is related to the detailed technical contents and inventive features thereof. People skilled in this field may proceed with a variety of modifications and replacements based on the disclosures and suggestions of the embodiments as described without departing from the characteristics thereof. Nevertheless, although such modifications and replacements are not fully disclosed in the above descriptions, they have substantially been covered in the following claims as appended.

What is claimed is:

1. A light emitting diode (LED) packaging structure, comprising:
   a metal pad having a first pad portion, a second pad portion and a gap, wherein the first pad portion has a first top surface, a first bottom surface and a first concave disposed on the first top surface, and wherein the second pad portion has a second top surface, a second bottom surface and a second concave disposed on the second top surface;
   a protection element having two first electrode portions respectively disposed in the first concave and the second concave and electrically connected to the first pad portion and the second pad portion respectively; and
   a LED chip located above the protection element and having two second electrode portions, the two second electrode portions being respectively disposed on the first top surface and the second top surface and electrically connected to the first pad portion and the second pad portion respectively.

2. The LED packaging structure of claim 1, further comprising a packaging encapsulant, wherein the packaging encapsulant has an encapsulant bottom surface and covers at least a part of the metal pad, the protection element and the LED chip.

3. The LED packaging structure of claim 2, wherein the packaging encapsulant comprises a transparent encapsulant or a fluorescent encapsulant.

4. The LED packaging structure of claim 2, wherein the packaging encapsulant exposes the first bottom surface and the second bottom surface.

5. The LED packaging structure of claim 2, wherein the encapsulant bottom surface is substantially coplanar with the first bottom surface or the second bottom surface.

6. The LED packaging structure of claim 2, wherein the encapsulant bottom surface faces away from the first bottom surface or the second bottom surface at a height which is 0.1 to 0.5 times of a thickness of the first pad portion or a thickness of the second pad portion.

7. The LED packaging structure of claim 2, wherein the first pad portion and the second pad portion respectively have a first flange and a second flange, and wherein the packaging encapsulant exposes the first flange and the second flange.

8. The LED packaging structure of claim 2, further comprising a first solder pad and a second solder pad, the first solder pad being disposed under the first bottom surface, the second solder pad being disposed under the second bottom surface, wherein an interval between the first solder pad and the second solder pad is wider than the gap.

9. The LED packaging structure of claim 8, wherein the first pad portion and the first solder pad are integral parts of one piece, and the second pad portion and the second solder pad are integral parts of another piece.

10. The LED packaging structure of claim 8, wherein the first solder pad and the second solder pad are not covered by the packaging encapsulant.

11. The LED packaging structure of claim 8, wherein the packaging encapsulant covers at least a portion of the first solder pad and a portion of the second solder pad.

12. The LED packaging structure of claim 2, wherein the packaging encapsulant fills and covers the gap.

13. The LED packaging structure of claim 2, wherein a top-view area of the packaging encapsulant is smaller than 1.3 times of a top-view area of the LED chip.

14. The LED packaging structure of claim 2, further comprising a space between the LED chip and the protection element, wherein the packaging encapsulant is filled in the space.

15. The LED packaging structure of claim 1, wherein depths of the first concave and the second concave are deeper than a thickness of the protection element.

16. The LED packaging structure of claim 1, further comprising a gap filler and a peripheral filler.

17. The LED packaging structure of claim 16, wherein the first pad portion further has a first lower concave and second pad portion further has a second lower concave, and wherein the first lower concave and the second lower concave form a buffering space.

18. The LED packaging structure of claim 1, wherein the metal pad further comprises a protective metal layer.

19. The LED packaging structure of claim 18, wherein the first concave and the second concave are covered with the protective metal layer.

20. The LED packaging structure of claim 1, wherein the LED chip covers the protection element entirely.

* * * * *